(12) United States Patent
Umeda et al.

(10) Patent No.: US 9,406,809 B2
(45) Date of Patent: Aug. 2, 2016

(54) FIELD-EFFECT TRANSISTOR

(71) Applicant: FUJIFILM Corporation, Minato-ku, Tokyo (JP)

(72) Inventors: Kenichi Umeda, Ashigarakami-gun (JP); Takamichi Fujii, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 12 days.

(21) Appl. No.: 14/024,881

(22) Filed: Sep. 12, 2013

(65) Prior Publication Data

US 2014/0008649 A1 Jan. 9, 2014

Related U.S. Application Data

(63) Continuation of application No. PCT/JP2012/053013, filed on Feb. 9, 2012.

(30) Foreign Application Priority Data

Mar. 18, 2011 (JP) .................................. 2011-060872

(51) Int. Cl.
*H01L 29/86* (2006.01)
*H01L 29/786* (2006.01)

(52) U.S. Cl.
CPC ...... *H01L 29/7869* (2013.01); *H01L 29/78603* (2013.01); *H01L 2924/0002* (2013.01)

(58) Field of Classification Search
CPC .................... H01L 29/7869; H01L 29/78603; H01L 29/78657
USPC ........................................................ 257/43
See application file for complete search history.

(56) References Cited

U.S. PATENT DOCUMENTS

| | | | | |
|---|---|---|---|---|
| 4,399,084 A | * | 8/1983 | Sagawa | .................... D01D 4/02 264/450 |
| 7,696,513 B2 | * | 4/2010 | Hayashi | .............. H01L 27/3211 257/40 |
| 2003/0092213 A1 | * | 5/2003 | Yamazaki | ............... H01L 27/12 438/48 |

FOREIGN PATENT DOCUMENTS

| | | |
|---|---|---|
| JP | 2003-131588 A | 5/2003 |
| JP | 2004-327872 A | 11/2004 |
| JP | 2004-342752 A | 12/2004 |
| WO | 2010/113376 A1 | 10/2010 |

OTHER PUBLICATIONS

William D. Calliste, Jr., Material Science and Engineering, An Introduction, 1994, John Wiley & Sons, Inc., 3rd Ed., pp. 645.*

(Continued)

*Primary Examiner* — Matthew W Such
*Assistant Examiner* — Warren H Kilpatrick
(74) *Attorney, Agent, or Firm* — Sughrue Mion, PLLC

(57) ABSTRACT

There is provided a field effect transistor having, on a substrate, at least a gate electrode, a gate insulating film, an active layer mainly containing an oxide semiconductor that contains at least one of In, Ga or Zn, a source electrode, and a drain electrode, the field effect transistor including: a heat diffusion layer, wherein, given that a thermal conductivity of the substrate is $N_{sub}$ (W/mK), a thermal conductivity of the heat diffusion layer is $N_{kaku}$ (W/mK), a film thickness of the heat diffusion layer is T (mm), a planar opening ratio of the heat diffusion layer is R ($0 \leq R \leq 1$), and $S = T \times R$, the thermal conductivity $N_{sub}$ of the substrate satisfies the condition $N_{sub} < 1.8$, and the thermal conductivity $N_{kaku}$ of the heat diffusion layer satisfies the conditions $N_{kaku} > 3.0 \times S^{\wedge}(-0.97 \times e^{\wedge}(-1.2 \times N_{sub}))$ and $N_{kaku} \geq N_{sub}$.

12 Claims, 33 Drawing Sheets

(56) References Cited

OTHER PUBLICATIONS

International Search Report for PCT/JP2012/053013 dated May 1, 2012, 2 pages.

Written Opinion for PCT/JP2012/053013 dated May 1, 2012, 8 pages in Japanese and English.

Notice of Reasons for Rejection, dated May 7, 2014, issued in corresponding JP Application No. 2011-060872, 4 pages in English and Japanese.

* cited by examiner

THERMAL CONDUCTIVITY
1W/mk

Tmax=144°C
Id≒180uA

THERMAL CONDUCTIVITY
100W/mk

Tmax=58°C
Id≒234uA

FIELD-EFFECT TRANSISTOR

CROSS-REFERENCE TO RELATED APPLICATIONS

This application is a continuation application of International Application No. PCT/JP2012/053013, filed Feb. 9, 2012, the disclosure of which is incorporated herein by reference in its entirety. Further, this application claims priority from Japanese Patent Application No. 2011-060872, filed Mar. 18, 2011, the disclosure of which is incorporated herein by reference in its entirety.

BACKGROUND

1. Technical Field

The present invention relates to a field effect transistor.

2. Related Art

Field effect transistors are widely used as unit elements of integrated circuits for semiconductor memories, high-frequency signal amplifying elements, elements for driving display elements such as liquid crystals, and the like. Field effect transistors that are made to be thin-filmed in particular are called thin film transistors (TFTs). Further, a silicon TFT, that has an active layer formed from amorphous silicon that can be formed over a large surface area, is used in flat panel displays.

The development of TFTs, that use In—Ga—Zn—O (IGZO) oxide semiconductors in the active layer (channel layer) instead of this amorphous silicon, has been carried out actively in recently years. With oxide semiconductors, film formation at a low temperature is possible, and oxide semiconductors exhibit higher mobility than amorphous silicon, and further, are transparent with respect to visible light. Therefore, a flexible and transparent TFT can be formed on a substrate such as a plastic plate or a film or the like.

By the way, in such field effect transistors, there are cases in which, due to a large current flowing when a high voltage is applied (at times of driving), Joule heat is generated and the temperature of the active layer rises locally. The generation of heat that arises at times of driving in this way is one cause that brings about deterioration in driving (deterioration in reliability).

Thus, Japanese Patent Application Laid-Open No. 2003-131588 proposes, in order to prevent generated heat that arises at the time of driving from being stored, forming a film, that has higher thermal conductivity than a glass substrate, as a heat dissipating layer at the upper layer or lower layer, or at the upper and lower layers, of the active layer of a thin film transistor.

However, Japanese Patent Application Laid-Open No. 2003-131588 does not at all mention the concrete relationship between the thermal conductivity of the substrate and the thermal conductivity of the heat dissipating layer, and it is unclear whether or not the film that has higher thermal conductivity than the glass substrate sufficiently achieves the function of a heat dissipating layer.

Thus, in a case in which an IGZO oxide semiconductor is used as an active layer, when the temperature at the time of heat generation becomes greater than or equal to 100° C., the minute amount of moisture that exists within the substrate or the active layer, the insulating layer or the electrodes is affected, and the so-called TFT characteristic is changed. Further, when the temperature at the time of heat generation becomes greater than or equal to 300° C., the oxygen that exists within the active layer changes, and the TFT characteristic is changed.

Further, in the fabrication of a flexible device that uses a resin substrate, because the thermal conductivity of the substrate is lower, it is predicted that it will be easy for heat to be stored and that the deterioration in driving that is due to heat generation will be more marked. Further, it is thought that such effects of heat generation are, at a resin substrate that has low heat resistance, a source that gives rise to changes in the dimensions of the substrate due to heat storage, and the like.

However, Japanese Patent Application Laid-Open No. 2003-131588 does not mention the above-described point whatsoever.

SUMMARY

The present invention was made in view of the above-described circumstances, and an object thereof is to provide a field effect transistor having a lowered heat generation temperature at the time of driving.

<1> A field effect transistor that has, on a substrate, at least a gate electrode, a gate insulating film, an active layer mainly containing an oxide semiconductor that contains at least one of In, Ga or Zn, a source electrode, and a drain electrode, the field effect transistor comprising: a heat diffusion layer that is the same as or separate from the gate insulating film, and that is different than the gate electrode, the source electrode and the drain electrode, wherein, given that a thermal conductivity of the substrate is $N_{sub}$ (W/mK), a thermal conductivity of the heat diffusion layer is $N_{kaku}$ (W/mK), a film thickness of the heat diffusion layer is T (mm), a planar opening ratio of the heat diffusion layer is R ($0 \leq R \leq 1$), and $S = T \times R$, the thermal conductivity $N_{sub}$ of the substrate satisfies the condition $N_{sub} < 1.8$, and the thermal conductivity $N_{kaku}$ of the heat diffusion layer satisfies the conditions $N_{kaku} > 3.0 \times S\hat{}(-0.97 \times e\hat{}(-1.2 \times N_{sub}))$ and $N_{kaku} \geq N_{sub}$.

<2> A field effect transistor that has, on a substrate, at least a gate electrode, a gate insulating film, an active layer mainly containing an oxide semiconductor that contains at least one of In, Ga or Zn, a source electrode, and a drain electrode, the field effect transistor comprising: a heat diffusion layer that is the same as or separate from the gate insulating film, and that is different than the gate electrode, the source electrode and the drain electrode, wherein, given that a thermal conductivity of the substrate is $N_{sub}$ (W/mK), a thermal conductivity of the heat diffusion layer is $N_{kaku}$ (W/mK), a film thickness of the heat diffusion layer is T (mm), a planar opening ratio of the heat diffusion layer is R ($0 \leq R \leq 1$), and $S = T \times R$, the thermal conductivity $N_{sub}$ of the substrate satisfies the condition $N_{sub} < 0.56$, and the thermal conductivity $N_{kaku}$ of the heat diffusion layer satisfies the conditions $N_{kaku} > 0.4 \times S\hat{}(-1.2 \times e\hat{}(-3.5 \times N_{sub}))$ and $N_{kaku} \geq N_{sub}$.

<3> The field effect transistor of <1> or <2>, wherein at least one layer or more of a thin film of less than or equal to 1 μm exists between the active layer and the heat diffusion layer.

<4> The field effect transistor of <3>, wherein the heat diffusion layer is a nitride film containing at least one of Al or Ga.

<5> The field effect transistor of <4>, wherein the transmittivity of the heat diffusion layer is greater than or equal to 70% with respect to light of a wavelength range of greater than or equal to 400 nm and less than or equal to 700 nm.

<6> The field effect transistor of any one of <1> through <5>, wherein the substrate is a resin substrate.

<7> A display device comprising the field effect transistor of <6>.

<8> A sensor comprising the field effect transistor of <6>.

In accordance with the present invention, there can be provided a field effect transistor having a lowered heat generation temperature at the time of driving.

BRIEF DESCRIPTION OF THE DRAWINGS

An exemplary embodiment of the present invention will be described in detail based on the following figures, wherein.

DETAILED DESCRIPTION

Figure 1A:
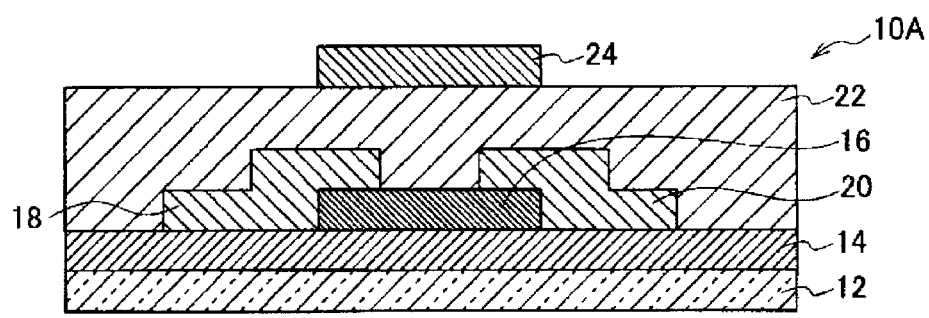
FIG. 1A is a schematic drawing illustrating an example of a TFT that has a top gate structure and is a top contacting type, and that is a TFT relating to an embodiment of the present invention.

A field effect transistor, display device and sensor relating to embodiments of the present invention are described concretely hereinafter with reference to the appended drawings. Note that, in the drawings, members (structural elements) that have the same or corresponding functions are denoted by the same reference numerals and description is omitted appropriately.

1. Field Effect Transistor

The field effect transistor relating to an embodiment of the present invention is described concretely by using a TFT as an example.

<Schematic Structure of TFT>

A TFT relating to an embodiment of the present invention is an active element that has a gate electrode, a gate insulating film, an active layer, a source electrode and a drain electrode, and that applies voltage to the gate electrode, and controls the current flowing to the active layer, and has the function of switching current between the source electrode and the drain electrode. Further, the TFT relating to the embodiment of the present invention further has a heat diffusion layer that is the same as or separate from the gate insulating film, and that is different from the gate electrode, the source electrode and the drain electrode.

The element structure of the TFT may be either of a so-called reverse staggered structure (also called bottom gate type) or a staggered structure (also called top gate type), that are based on the position of the gate electrode. Further, the TFT may be either of a so-called top contacting type or bottom contacting type, that is based on the contacting portions of the active layer and the source electrode and the drain electrode (hereinafter called "source/drain electrodes" when appropriate).

Note that a top gate type is a form in which the gate electrode is disposed at the upper side of the gate insulating film, and the active layer is formed at the lower side of the gate insulating film. A bottom gate type is a form in which the gate electrode is disposed at the lower side of the gate insulating film, and the active layer is formed at the upper side of the gate insulating film. Further, a bottom contacting type is a form in which the source/drain electrodes are formed before the active layer, and the bottom surface of the active layer contacts the source/drain electrodes. A top contacting type is a form in which the active layer is formed before the source/drain electrodes, and the top surface of the active layer contacts the source/drain electrodes.

FIG. 1A is a schematic drawing illustrating an example of a TFT that has a top gate structure and is a top contacting type, and that is a TFT relating to an embodiment of the present invention. In a TFT 10A shown in FIG. 1A, a heat diffusion layer 14, which relates to an embodiment of the present invention, and an active layer 16 are layered in order on one main surface of a substrate 12. Further, a source electrode 18 and a drain electrode 20 are set so as to be apart from one another on this active layer 16, and further, a gate insulating film 22 and a gate electrode 24 are layered in order on these.

Figure 1B:
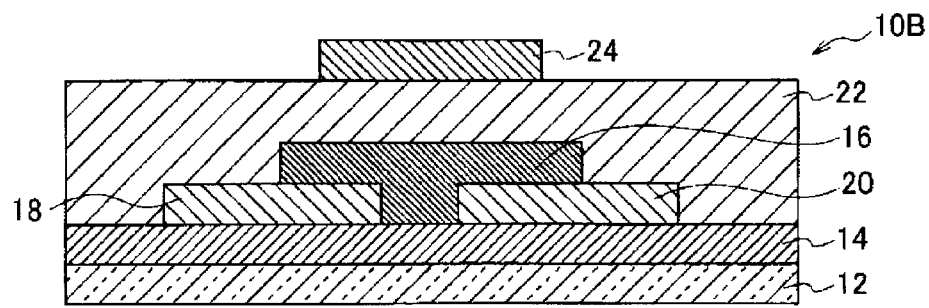
FIG. 1B is a schematic drawing illustrating an example of a TFT that has a top gate structure and is a bottom contacting type, and that is a TFT relating to an embodiment of the present invention.

FIG. 1B is a schematic drawing illustrating an example of a TFT that has a top gate structure and is a bottom contacting type, and that is a TFT relating to an embodiment of the present invention. In a TFT 10B shown in FIG. 1B, the heat diffusion layer 14, which relates to an embodiment of the present invention, is layered on one main surface of the substrate 12, and the source electrode 18 and the drain electrode 20 are set so as to be apart from one another on this heat diffusion layer 14. Further, the active layer 16, the gate insulating film 22, and the gate electrode 24 are layered in order.

Figure 1C:
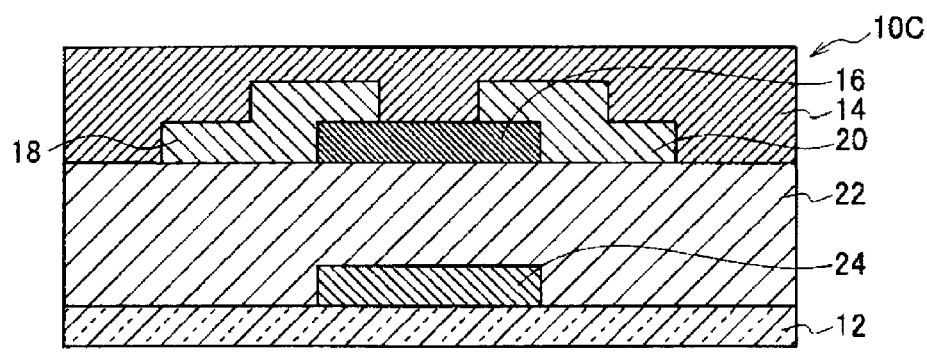
FIG. 1C is a schematic drawing illustrating an example of a TFT that has a bottom gate structure and is a top contacting type, and that is a TFT relating to an embodiment of the present invention.

FIG. 1C is a schematic drawing illustrating an example of a TFT that has a bottom gate structure and is a top contacting type, and that is a TFT relating to an embodiment of the present invention. In a TFT 10C shown in FIG. 1C, the gate electrode 24, the gate insulating film 22, and the active layer 16 are layered in order on one main surface of the substrate 12. Further, the source electrode 18 and the drain electrode 20 are set so as to be apart from one another on the surface of this active layer 16. The heat diffusion layer 14, which relates to an embodiment of the present invention, is layered on the source electrode 18 and the drain electrode, the active layer 16.

Figure 1D:
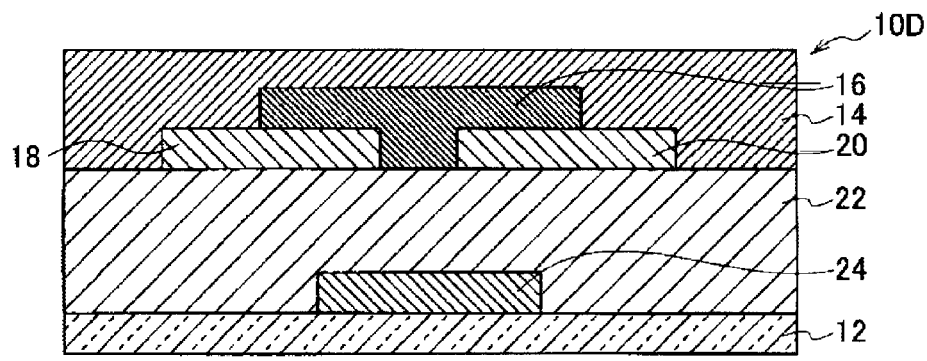
FIG. 1D is a schematic drawing illustrating an example of a TFT that has a bottom gate structure and is a bottom contacting type, and that is a TFT relating to an embodiment of the present invention.

FIG. 1D is a schematic drawing illustrating an example of a TFT that has a bottom gate structure and is a bottom contacting type, and that is a TFT relating to an embodiment of the present invention. In a TFT 10D shown in FIG. 1D, the gate electrode 24 and the gate insulating film 22 are layered in order on one main surface of the substrate 12. Further, the source electrode 18 and the drain electrode 20 are set so as to be apart from one another on the surface of this gate insulating film 22, and moreover, the active layer 16 and the heat diffusion layer 14, which relates to an embodiment of the present invention, are layered in order on these.

Note that the TFT relating to the present embodiment can be made to be various structures other than those described above, and may be a structure that appropriately has a protective layer on the active layer, or an insulating layer on the substrate, or the like.

As shown in FIGS. 1A through D, from the standpoint of dispersing the generated heat of the active layer 16, the placement of the heat diffusion layer 14 is preferably directly below or directly above the active layer 16. From the standpoint of affecting the characteristic of the TFT, the heat diffusion layer 14 is more preferably set at the side opposite the interface of the gate insulating film with the active layer. However, the placement of the heat diffusion layer 14 is not particularly limited, and the heat diffusion layer 14 may be disposed at the surface of the substrate that is at the side opposite the gate electrode 24 side, or may be disposed both above and below the active layer 16. Further, at least one or more thin films of less than or equal to 1 μm may be disposed between the active layer 16 and the heat diffusion layer 14. For example, in the bottom gate type oxide TFTs 10C, 10D, an unillustrated protective layer that is disposed above the active layer 16 is important for stabilizing driving, and therefore, it is preferable to place the heat diffusion layer 14 on the protective layer as a layer separate from the protective layer. Further, in the bottom gate type oxide TFTs 10C, 10D, the heat diffusion layer 14 can also be disposed between the gate electrode 24 and the substrate 12.

Further, the gate insulating film 22 itself may be made to have the function of the heat diffusion layer 14, without disposing the heat diffusion layer 14 separately from the structures of the gate electrode 24 and the gate insulating film 22 and the like. Further, an unillustrated interlayer insulating film or insulating film itself can also be made to have the function of the heat diffusion layer 14.

Examples of cases in which one layer of a thin film that is less than or equal to 1 μm is disposed beneath the active layer 16 between the active layer 16 and the heat diffusion layer 14 are given hereinafter.

Figure 2A:
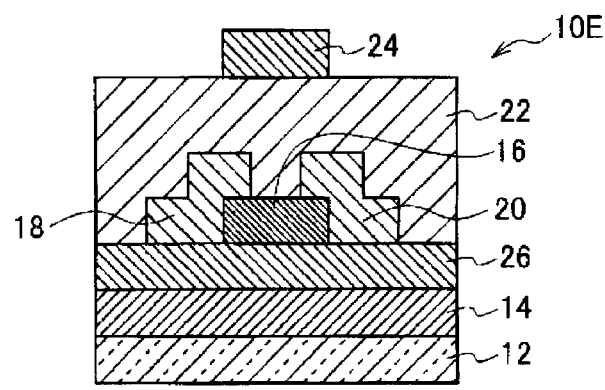
FIG. 2A is a schematic drawing illustrating an example of a TFT that has a top gate structure and is a top contacting type, and that is a TFT relating to an embodiment of the present invention.

FIG. 2A is a schematic drawing illustrating an example of a TFT that has a top gate structure and is a top contacting type, and that is a TFT relating to an embodiment of the present invention. In a TFT 10E shown in FIG. 2A, the heat diffusion layer 14, which relates to an embodiment of the present invention, and an insulating layer 26 and the active layer 16 are layered in order on one main surface of the substrate 12. Further, the source electrode 18 and the drain electrode 20 are set so as to be apart from one another on this active layer 16, and moreover, the gate insulating film 22 and the gate electrode 24 are layered in order on these.

Figure 2B:
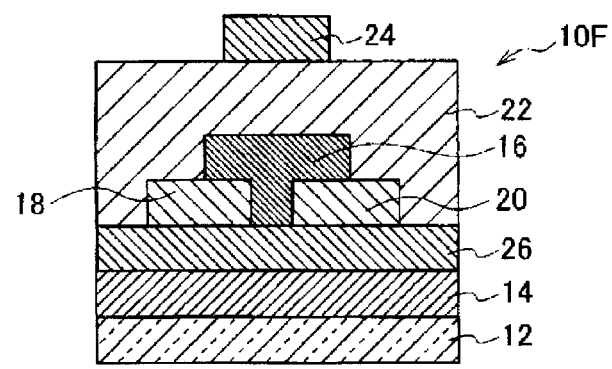
FIG. 2B is a schematic drawing illustrating an example of a TFT that has a top gate structure and is a bottom contacting type, and that is a TFT relating to an embodiment of the present invention.

FIG. 2B is a schematic drawing illustrating an example of a TFT that has a top gate structure and is a bottom contacting type, and that is a TFT relating to an embodiment of the present invention. In a TFT 10F shown in FIG. 2B, the heat diffusion layer 14, that relates to an embodiment of the present invention, and the insulating layer 26 are layered in order on one main surface of the substrate 12, and the source electrode 18 and the drain electrode 20 are set so as to be apart from one another on this insulating layer 26. Further, the active layer 16, the gate insulating film 22, and the gate electrode 24 are layered in order.

Figure 2C:
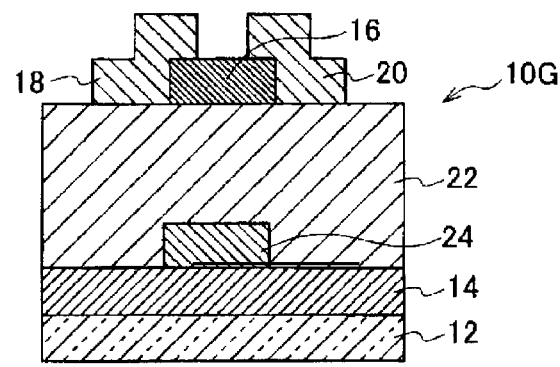
FIG. 2C is a schematic drawing illustrating an example of a TFT that has a bottom gate structure and is a top contacting type, and that is a TFT relating to an embodiment of the present invention.

FIG. 2C is a schematic drawing illustrating an example of a TFT that has a bottom gate structure and is a top contacting type, and that is a TFT relating to an embodiment of the present invention. In a TFT 10G shown in FIG. 2C, the heat diffusion layer 14 that relates to an embodiment of the present invention, the gate electrode 24, the gate insulating film 22, and the active layer 16 are layered in order on one main surface of the substrate 12. Further, the source electrode 18 and the drain electrode 20 are set so as to be apart from one another on the surface of this active layer 16.

Figure 2D:
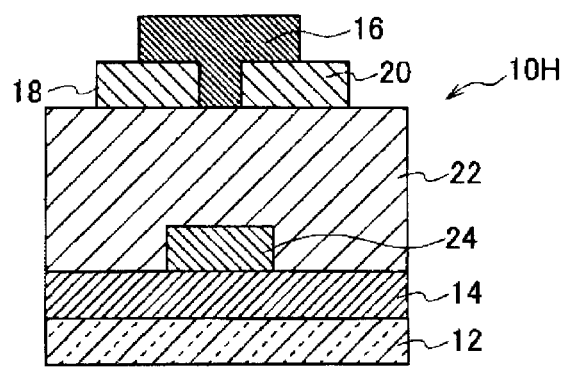
FIG. 2D is a schematic drawing illustrating an example of a TFT that has a bottom gate structure and is a bottom contacting type, and that is a TFT relating to an embodiment of the present invention.

FIG. 2D is a schematic drawing illustrating an example of a TFT that has a bottom gate structure and is a bottom contacting type, and that is a TFT relating to an embodiment of the present invention. In a TFT 10H shown in FIG. 2D, the heat diffusion layer 14 that relates to an embodiment of the present invention, the gate electrode 24, and the gate insulating film 22 are layered in order on one main surface of the substrate 12. Further, the source electrode 18 and the drain electrode 20 are set so as to be apart from one another on the surface of this gate insulating film 22, and moreover, the active layer 16 is layered on these.

Examples of cases in which one layer of a thin film that is less than or equal to 1 μm is disposed above the active layer 16 between the active layer 16 and the heat diffusion layer 14 are given next.

Figure 3A:
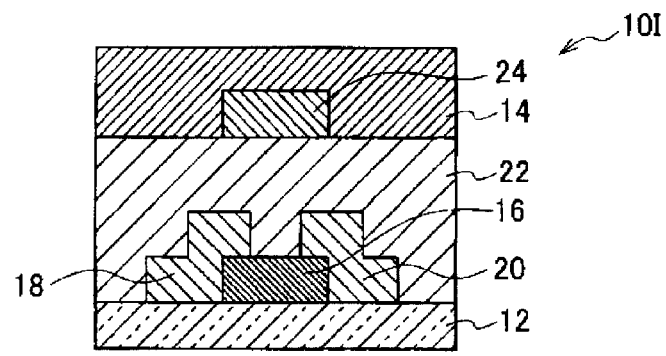
FIG. 3A is a schematic drawing illustrating an example of a TFT that has a top gate structure and is a top contacting type, and that is a TFT relating to an embodiment of the present invention.

FIG. 3A is a schematic drawing illustrating an example of a TFT that has a top gate structure and is a top contacting type, and that is a TFT relating to an embodiment of the present invention. In a TFT 10I shown in FIG. 3A, the active layer 16 is layered on one main surface of the substrate 12. Further, the source electrode 18 and the drain electrode 20 are set so as to be apart from one another on this active layer 16, and moreover, the gate insulating film 22, the gate electrode 24, and the heat diffusion layer 14 that relates to an embodiment of the present invention, are layered in order on these.

Figure 3B:
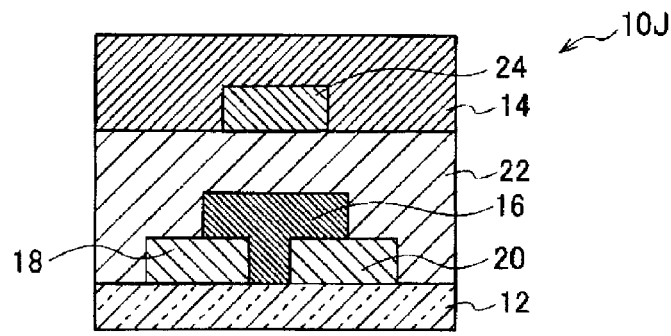
FIG. 3B is a schematic drawing illustrating an example of a TFT that has a top gate structure and is a bottom contacting type, and that is a TFT relating to an embodiment of the present invention.

FIG. 3B is a schematic drawing illustrating an example of a TFT that has a top gate structure and is a bottom contacting type, and that is a TFT relating to an embodiment of the present invention. In a TFT 10J shown in FIG. 3B, the source electrode 18 and the drain electrode 20 are set so as to be apart from one another on one main surface of the substrate 12. Further, the active layer 16, the gate insulating film 22, the gate electrode 24, and the heat diffusion layer 14 that relates to an embodiment of the present invention, are layered in order.

Figure 3C:
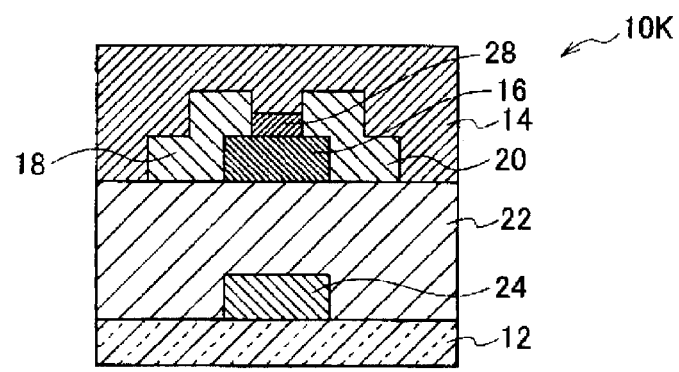
FIG. 3C is a schematic drawing illustrating an example of a TFT that has a bottom gate structure and is a top contacting type, and that is a TFT relating to an embodiment of the present invention.

FIG. 3C is a schematic drawing illustrating an example of a TFT that has a bottom gate structure and is a top contacting type, and that is a TFT relating to an embodiment of the present invention. In a TFT 10K shown in FIG. 3C, the gate electrode 24, the gate insulating film 22 and the active layer 16 are layered in order on one main surface of the substrate 12. Further, the source electrode 18 and the drain electrode 20 are set so as to be apart from one another on the surface of this active layer 16. Further, a protective film 28 is layered on the active layer 16 between the source electrode 18 and the drain electrode 20, and the heat diffusion layer 14 that relates to an embodiment of the present invention is layered on the protective film 28 and the source electrode 18, the drain electrode 20. Note that, in the case of a bottom gate structure, it is thought that it is important to protect the back channel for the stability of the TFT, and the protective film 28 is layered.

Figure 3D:
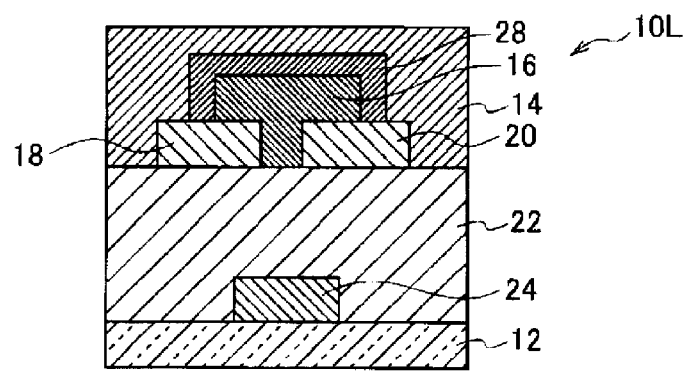
FIG. 3D is a schematic drawing illustrating an example of a TFT that has a bottom gate structure and is a bottom contacting type, and that is a TFT relating to an embodiment of the present invention.

FIG. 3D is a schematic drawing illustrating an example of a TFT that has a bottom gate structure and is a bottom contacting type, and that is a TFT relating to an embodiment of the present invention. In a TFT 10L shown in FIG. 3D, the gate electrode 24 and the gate insulating film 22 are layered in order on one main surface of the substrate 12. Further, the source electrode 18 and the drain electrode 20 are set so as to be apart from one another on the surface of this gate insulating film 22, and moreover, the active layer 16 is layered on these. The periphery of the active layer 16 is covered by the protective film 28, and the periphery of the protective film 28 is further covered by the heat diffusion layer 14 that relates to an embodiment of the present invention. Note that, in the case of a bottom gate structure, it is thought that it is important to protect the back channel for the stability of the TFT, and the active layer 16 is covered by the protective film 28.

The respective structural elements are described in detail hereinafter. Note that a case in which the TFT 10A, that has a top gate structure and is a top contacting type and is shown in FIG. 1A, is described concretely as a representative example, but the present invention can similarly be applied also to cases of fabricating TFTs of other forms.

<Detailed Structure of TFT>

—Substrate—

First, the substrate 12 for forming the TFT 10A is readied. The shape, structure, size and the like of the substrate 12 are not particularly limited, and can be selected appropriately in accordance with the object. The structure of the substrate 12 may be a single-layer structure or may be a layered structure.

Further, the substrate 12 relating to the embodiment of the present invention is a substrate having a low thermal conductivity. Given that the thermal conductivity thereof is $N_{sub}$ (W/mK), the thermal conductivity $N_{sub}$ satisfies the condition $N_{sub} < 1.8$ W/mK. This is because, when this condition is satisfied, the heat generation temperature (maximum temperature) at the time of driving, in a case in which the driving conditions are Vg=20 V and Vds=50 V, becomes greater than or equal to 100° C., and a special structure (the introduction of the heat diffusion layer 14), that causes the heat generation temperature at the time of driving to decrease to below 100° C., is needed in particular.

Or, the substrate 12 relating to the embodiment of the present invention satisfies the condition $N_{sub} < 0.56$ W/mK. This is because, when this condition is satisfied, the heat generation temperature (maximum temperature) at the time of driving, in a case in which the driving conditions are Vg=20 V and Vds=50 V, becomes greater than or equal to 300° C., and a special structure (the introduction of the heat diffusion layer 14), that causes the heat generation temperature at the time of driving to decrease to below 300° C., is needed in particular.

If the material of the substrate 12 satisfies $N_{sub} < 1.8$ W/mK or $N_{sub} < 0.56$ W/mK, the material is not particularly limited. Further, even in cases in which the material itself does not satisfy the condition $N_{sub} < 1.8$ W/mK or $N_{sub} < 0.56$ W/mK, the substrate 12 may be made to satisfy either of these conditions by the material thereof being doped with a predetermined element.

For example, inorganic substrates such as glass ($N_{sub}$=1.0 W/mK), YSZ (yttria-stabilized zirconium) ($N_{sub}$=1.4 W/mK), and the like, or resin substrates, or composite materials thereof, or the like can be used. Among these, from the standpoint of being light weight and from the standpoint of having flexibility, resin substrates and composite materials thereof are preferable. Although mention of the thermal conductivities of some of these is omitted, concretely, composite resin substrates of polybutylene terephthalate ($N_{sub}$=0.21 to 0.25 W/mK), polyethylene terephthalate ($N_{sub}$=0.20 to 0.33 W/mK), polyethylene naphthalate ($N_{sub}$=0.20 to 0.33 W/mK), polybutylene naphthalate, polystyrene ($N_{sub}$=0.108 W/mK), polycarbonate ($N_{sub}$=0.19 W/mK), polysulfone, polyethersulfone ($N_{sub}$=0.32 W/mK), polyallylate ($N_{sub}$=0.24 W/mK), allyl diglycol carbonate, polyamide ($N_{sub}$=0.24 W/mK), polyimide ($N_{sub}$=0.28 to 0.34 W/mK), polyamide-imide ($N_{sub}$=0.38 W/mK), polyetherimide ($N_{sub}$=0.22 W/mK), polybenzoazole ($N_{sub}$=0.23 W/mK), polyphenylene sulfide, polycycloolefin, norbornene resins, fluorine resins such as polychlorotrifluoroethylene ($N_{sub}$=0.20 to 0.22 W/mK), and the like, liquid crystal polymers, acrylic resins ($N_{sub}$=0.21 W/mK), epoxy resins ($N_{sub}$=0.17 to 0.21 W/mK), silicon resins ($N_{sub}$=0.15 to 0.17 W/mK), ionomer resins, cyanate resins, cross-linked fumaric acid diester, cyclic polyolefins, aromatic ethers, maleimide-olefin, cellulose, episulfide compounds and the like, compound plastic materials with silicon oxide particles, compound plastic materials with metal nanoparticles, inorganic oxide nanoparticles, inorganic nitride nanoparticles and the like, compound plastic materials with carbon fibers or carbon nanotubes, compound plastic materials with glass flake, glass fibers or glass beads, compound plastic materials with clay minerals or particles having a mica crystal structure, laminated plastic materials having a junction interface of at least one time between thin glass and the aforementioned individual organic materials, a composite material having a barrier performance and having a junction interface of at least one or more times due to inorganic layers and organic layers being layered alternately, a stainless steel substrate or a metal multi-layer substrate in which stainless steel and different type of metal are laminated, an aluminum substrate or an aluminum substrate with an oxide surface film having an improved insulating ability of the surface due to the surface being subjected to an oxidizing treatment (e.g., an anodic oxidation treatment), and the like can be used.

In a case in which the substrate 12 is a resin substrate in particular, it is easy to satisfy the condition $N_{sub}$<1.8 W/mK or $N_{sub}$<0.56 W/mK, and the heat generation temperature (maximum temperature) at the time of driving, in a case in which the driving conditions are Vg=20 V and Vds=50 V, becomes greater than or equal to 100° C. or greater than or equal to 300° C., and a special structure (the introduction of the heat diffusion layer 14), that causes the heat generation temperature at the time of driving to decrease to below 100° C. or below 300° C., is needed in particular.

Further, the fact that resin substrates have excellent heat-resistance, dimensional stability, solvent resistance, electrical insulating ability, workability, low permeability, low moisture absorbing ability, and the like, is preferable. The aforementioned resin substrates may have a gas barrier layer for preventing passage of moisture and oxygen, or an undercoat layer for improving the flatness of the resin substrate and the adhesiveness with the lower electrodes, or the like.

Further, the thickness of the substrate 12 in the present invention is not particularly limited, but greater than or equal to 50 µm and less than or equal to 1000 µm is preferable, and greater than or equal to 50 µm and less than or equal to 500 µm is more preferable. When the thickness of the substrate 12 is greater than or equal to 50 µm, the flatness of the substrate 12 itself improves more. Further, when the thickness of the substrate 12 is less than or equal to 500 µm, the flexibility of the substrate 12 itself improves more, and usage as a substrate for a flexible device is even easier.

Note that, in the present embodiment, the thermal conductivities of the substrate 12 and the heat diffusion layer 14 can be specified in accordance with a measurement method such as a laser flash method, a hot wire method, a flat plate heat flow meter method, or a temperature gradient method or the like.

—Active Layer—

Next, the active layer 16 is formed on the substrate 12.

The active layer 16 mainly contains an oxide semiconductor that contains at least one type among In, Ga, Zn. In particular, oxide semiconductors (e.g., In—Zn—O type, In—Ga—O type, Ga—Zn—O type) that contain at least two types among In, Ga, Zn are preferable, and oxide semiconductors that contain all of In, Ga, Zn are more preferable. As In—Ga—Zn—O oxide semiconductors, oxide semiconductors whose composition in a crystal state is expressed by InGaO$_3$(ZnO)$_m$ (m is a natural number of less than 6) are preferable, and, in particular, InGaZnO$_4$ is more preferable. A characteristic of an oxide semiconductor of this composition is that it shows the tendency that the electron mobility increases as the degree of electrical conduction increases.

However, the composition ratio of the IGZO does not have to strictly be In:Ga:Zn=1:1:1. Further, it suffices for the active layer to contain an oxide semiconductor, such as those described above, as the main component thereof, and the active layer may, in addition thereto, contain impurities or the like. Here, "main component" means that, among the structural components that structure the active layer, the component that is contained in the greatest amount.

Note that the layer structure of the active layer 16 may be structured from two or more layers.

Further, the active layer 16 may be either of amorphous or crystalline. However, if the active layer 16 is amorphous, film formation at a low temperature is possible, and therefore, the active layer is suitably formed on the substrate 12 that is flexible. Note that whether the active layer 16 is amorphous or not can be confirmed by X-ray diffraction measurement. Namely, if clear peaks expressing a crystalline structure are not detected from X-ray diffraction measurement, it can be judged that the active layer 16 is amorphous.

The film thickness of the active layer 16 is not particularly limited, but, from the standpoints of flatness of the thin film and the film formation time, greater than or equal to 5 nm and less than or equal to 150 nm is preferable.

The film forming method of the active layer 16 is not particularly limited, but a vapor-phase film forming method or a solution method (sol-gel, MOD, nanoparticles, CSD, or the like) can be used. Among these, from the standpoint of ease of forming a film of a large surface area, it is preferable to use a vapor-phase film forming method in which the target is a polycrystalline sintered body of an oxide semiconductor that contains at least one type among In, Ga, Zn. Among vapor-phase film forming methods, a sputtering method and a pulse laser deposition method (PLD method) are suitable. Further, from the standpoint of mass-produceability, a sputtering method is preferable. For example, by an RF magnetron sputtering deposition method, a film is formed while controlling the degree of vacuum and the oxygen flow amount.

After film formation of the active layer 16, this thin film is patterned in accordance with the device. The patterning can be carried out by photolithography and etching. Concretely, a pattern is formed by forming a resist pattern by photolithography at the portions that are to remain, and by etching by an acid solution of hydrochloric acid, nitric acid, dilute sulfuric acid, or a mixed liquid of phosphoric acid, nitric acid and acetic acid, or the like. Note that, in the case of a solvent method, direct patterning may be carried out by using an inkjet or a dispenser or the like, without using photolithography and the like.

—Heat Diffusion Layer—

The heat diffusion layer 14 is formed on the active layer 16. This heat diffusion layer 14 satisfies the following conditions.

Namely, given that the thermal conductivity of the heat diffusion layer 14 is $N_{kaku}$ (W/mK), and the film thickness of the heat diffusion layer 14 is T (mm), and the planar opening ratio of the heat diffusion layer 14 is R ($0 \leq R \leq 1$), and $S = T \times R$, in a case in which the thermal conductivity $N_{sub}$ of the substrate 12 satisfies the condition $N_{sub} < 0.56$, the thermal conductivity $N_{kaku}$ of the heat diffusion layer 14 satisfies the conditions $N_{kaku} > 0.4 \times S^{\wedge}(-1.2 \times e^{\wedge}(-3.5 \times N_{sub}))$ and $N_{kaku}$ N. If the thermal conductivity $N_{sub}$ of the substrate 12 satisfies the above-described condition, the heat generation temperature (maximum temperature) at the time of driving, in a case in which the driving conditions are Vg=20 V and Vds=50 V, can become greater than or equal to 300° C., but if the thermal conductivity $N_{kaku}$ of the heat diffusion layer 14 is made to satisfy the above-described conditions, the aforementioned heat generation temperature at the time of driving can be lowered to less than 300° C.

Further, if the thermal conductivity $N_{sub}$ of the substrate 12 satisfies the condition $N_{sub} < 1.8$, the thermal conductivity $N_{kaku}$ of the heat diffusion layer 14 satisfies the conditions $N_{kaku} > 3.0 \times S^{\wedge}(-0.97 \times e^{\wedge}(-1.2 \times N_{sub}))$ and $N_{kaku}$ N. If the thermal conductivity $N_{sub}$ of the substrate 12 satisfies the above-described condition, the heat generation temperature (maximum temperature) at the time of driving, in a case in which the driving conditions are Vg=20 V and Vds=50 V, can become greater than or equal to 100° C., but if the thermal conductivity $N_{kaku}$ of the heat diffusion layer 14 is made to satisfy the above-described conditions, the aforementioned heat generation temperature at the time of driving can be lowered to less than 100° C.

Adjustment of the thermal conductivity $N_{kaku}$ of the heat diffusion layer 14 can be carried out by controlling the structural material of the heat diffusion layer 14 and the composition ratio thereof, the film thickness T (mm) of the heat diffusion layer 14, the planar opening ratio R ($0 \leq R \leq 1$) of the heat diffusion layer 14, the crystallinity, and the like.

The structural material of the heat diffusion layer 14 is not particularly limited provided that the thermal conductivity $N_{kaku}$ of the heat diffusion layer 14 is made to satisfy the above-described conditions, and may be a material in which a metal mesh having a high opening ratio or minute particles or a filler or the like is dispersed. However, from the standpoint of making the electrical conductivity low to a certain extent (making the heat diffusion layer 14 be insulating) because effects of the parasitic capacity are of concern when the electrical conductivity is high, it is preferable that the structural material is a nitride film containing at least one of Al, Si, Ga, N, O, C, and the volume resistivity p thereof is greater than or equal to $\rho \geq 10^2$ Ωcm. Among these, from the standpoint of having transparency, the structural material is preferably a nitride film containing at least one of Al, Ga. Further, from the standpoints of visible light transparency, insulating ability and thermal conductivity all being good (high), it is preferable that the structural material is a metal nitride (in particular, AlN($N_{kaku}$=150 W/mK) or SiC.

Concretely, various combinations can be given as examples of the combination of the structural material of the substrate 12 and the structural material of the heat diffusion layer 14 that satisfy all of the conditions relating to the embodiment of the present invention. For example, the combination of the structural material of the substrate 12 being glass ($N_{sub}$=1.0 W/mK) and the structural material of the heat diffusion layer 14 being AlN($N_{kaku}$=150 W/mK) is given as an example.

Control of the film thickness T (mm) of the heat diffusion layer 14 can be carried out by controlling the film forming rate by changing the film formation time and, in the case of sputtering, the input power, the target-substrate distance, the film formation pressure, and the like. Namely, in the case of the film formation time, by making the film formation time be long, the film thickness can be thickened, and, by making the film formation time be short, the film thickness can be made to be thin.

Control of the planar opening ratio R ($0 \leq R \leq 1$) of the heat diffusion layer 14 can be carried out by lithography or the like.

From the standpoint of visible light transparency, the transmittivity of the heat diffusion layer 14 is preferably greater than or equal to 70% with respect to light of a wavelength range of greater than or equal to 400 nm and less than or equal to 700 nm.

Note that the layer structure of the heat diffusion layer 14 may be structured from two or more layers.

Further, the heat diffusion layer 14 may be either amorphous or crystalline. However, if amorphous, film formation at a low temperature is possible, and therefore, the heat diffusion layer is suitably formed on the substrate 12 that is flexible.

As the film forming method of the heat diffusion layer 14, it is preferable to use, for example, a vapor-phase film forming method in which the target is a polycrystalline sintered body of a nitride film that contains at least one of Al, Si, Ga, N, O, C. Among vapor-phase film forming methods, a sputtering method and a pulse laser deposition method (PLD method) are suitable. Further, from the standpoint of mass-produceability, a sputtering method is preferable. For example, by an RF magnetron sputtering deposition method, a film is formed while controlling the degree of vacuum and the oxygen flow amount. However, a solution method can also be used for the heat diffusion layer 14, in the same way as for the active layer 16.

After film formation of the heat diffusion layer 14, this thin film is patterned in accordance with the device. Note that the above describes a case of a top gate structure, but, in the case of a bottom gate structure, rather than carrying out patterning before forming the active layer 16, it is preferable to carry out patterning simultaneously with the active layer 16 in order to eliminate the effects of interface contamination.

—Source/Drain Electrodes—

An electrically conductive film for forming the source/drain electrodes 18, 20 is formed on the heat diffusion layer 14.

The source/drain electrodes can be formed by using a material having high electrical conductivity, and can be formed by using, for example, a metal such as Al, Mo, Cr, Ta, Ti, Au or the like, or a metal oxide electrically conductive film of Al—Nd, an Ag alloy, tin oxide, zinc oxide, indium oxide, indium tin oxide (ITO), indium zinc oxide (IZO) or the like, or the like. These electrically conductive films can be used as a single-layer structure or a layered structure of two or more layers as the source/drain electrodes 18, 20.

In forming the source/drain electrodes 18, 20, a film is formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like.

In consideration of film formability, and the ability to be patterned by etching or a lift-off method, and the electrical conductivity and the like, the film thickness of the electrically conductive film that is formed is preferably made to be greater than or equal to 10 nm and less than or equal to 1000 nm, and more preferably made to be greater than or equal to 50 nm and less than or equal to 500 nm.

Next, the formed electrically conductive film is patterned in a predetermined shape by etching or a lift-off method, and the source electrode and the drain electrode 18, 20 are formed. At this time, it is preferable to simultaneously carry out patterning of the wires that are connected to the source/drain electrodes 18, 20.

—Gate Insulating Film—

After the source/drain electrodes 18, 20 and the wires are formed, the gate insulating film 22 is formed.

The gate insulating film 22 is preferably a film having a high insulating ability, and may be an insulating film of, for example, $SiO_2$, SiNx, SiON, $Al_2O_3$, $Y_2O_3$, $Ta_2O_5$, $HfO_2$ or the like, or may be an insulating film that contains at least two or more of these compounds. The gate insulating film 22 is formed in accordance with a method that is appropriately selected, in consideration of the suitability with the material that is used, from among wet methods such as a printing method, a coating method or the like, physical methods such as a vacuum deposition method, a sputtering method, an ion plating method or the like, chemical methods such as CVD, a plasma CVD method or the like, and the like.

Next, the gate insulating film 22 is patterned into a predetermined shape by photolithography and etching.

Note that the gate insulating film 22 must have thickness in order to decrease the leak current and improve the voltage tolerance, but on the other hand, if the thickness of the gate insulating film is too large, it leads to a rise in the driving voltage. Although it depends on the material of the gate insulating film as well, the thickness of the gate insulating film is preferably greater than or equal to 10 nm and less than or equal to 10 μm, and more preferably greater than or equal to 50 nm and less than or equal to 1000 nm, and particularly preferably greater than or equal to 100 nm and less than or equal to 400 nm.

—Gate Electrode—

After the gate insulating film 22 is formed, the gate electrode 24 is formed.

The gate electrode 24 can be formed by using a material having high electrical conductivity, and can be formed by using, for example, a metal such as Al, Mo, Cr, Ta, Ti, Au or the like, or a metal oxide electrically conductive film of Al—Nd, an Ag alloy, tin oxide, zinc oxide, indium oxide, indium tin oxide (ITO), indium zinc oxide (IZO) or the like, or the like. These electrically conductive films can be used as a single-layer structure or a layered structure of two or more layers as the gate electrode 24.

The gate electrode 24 is film-formed in accordance with a method that is selected appropriately in consideration of the suitability with the material that is used, from among, for example, wet methods such as a printing method, a coating method or the like, physical methods such as a vacuum deposition method, a sputtering method, an ion plating method or the like, chemical methods such as CVD, a plasma CVD method or the like, and the like. In consideration of film formability, and the ability to be patterned by etching or a lift-off method, and the electrical conductivity and the like, the film thickness of the electrically conductive film that is formed is preferably made to be greater than or equal to 10 nm and less than or equal to 1000 nm, and more preferably made to be greater than or equal to 50 nm and less than or equal to 500 nm.

After film formation, the electrically conductive film is patterned in a predetermined shape by etching or a lift-off method, and the gate electrode 24 is formed. At this time, it is preferable to simultaneously carry out patterning of the gate electrode 24 and the gate wires.

The TFT 10A, that has a top gate structure and is a top contacting type relating to an embodiment of the present invention, is fabricated by the above-described fabrication method.

2. Application

There are no limitations in particular on the application of the TFT of the present embodiment that is described above, but the TFT is suitable as a driving element in, for example, electro-optical devices (e.g., display devices such as liquid crystal display devices, organic EL (Electro Luminescence) display devices, inorganic EL display devices and the like, or the like), and particularly in cases of being used in a large-surface-area device.

Moreover, the TFT of the present embodiment is particularly suited to devices that can be fabricated by low-temperature processes using a resin substrate (e.g., flexible displays or the like), and is suitably used as a driving element (a driving circuit) in various types of electronic devices such as various types of sensors such as X-ray sensors or the like, or MEMS (Micro Electro Mechanical Systems), or the like.

3. Electro-Optical Device and Sensor

An electro-optical device or sensor of the present embodiment is structured to have the above-described TFT of the present invention.

Examples of the electro-optical device are display devices (e.g., liquid crystal display devices, organic EL display devices, inorganic EL display devices, and the like).

Image sensors such as CCDs (Charge Coupled Devices) or CMOSs (Complementary Metal Oxide Semiconductors) and the like, and X-ray sensors and the like are suitable as examples of the sensor.

The electro-optical device or sensor of the present embodiment exhibits a good characteristic by consuming little electric power. What is called characteristic here means the display characteristic in the case of an electro-optical device (display device) and the sensitivity characteristic in the case of a sensor.

Hereinafter, a liquid crystal display device, an organic EL display device, and an X-ray sensor are described as representative examples of the electro-optical device or sensor that has the thin-film transistor that is fabricated by the present invention.

4. Liquid Crystal Display Device

Figure 4:
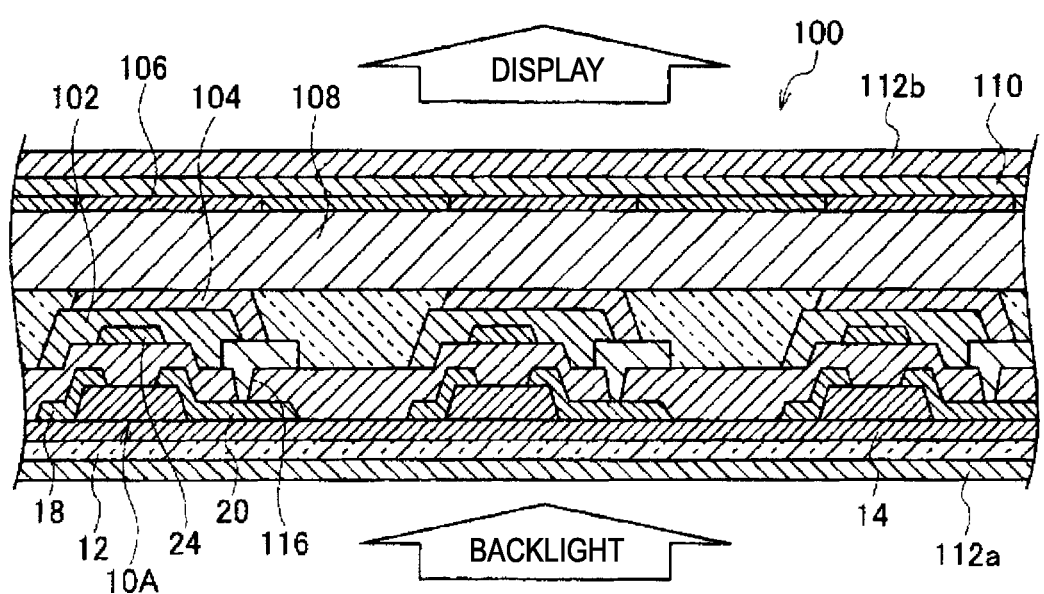
FIG. 4 is a schematic sectional view of a portion of a liquid crystal display device that is an embodiment of an electro-optical device of the present invention.
Figure 5:
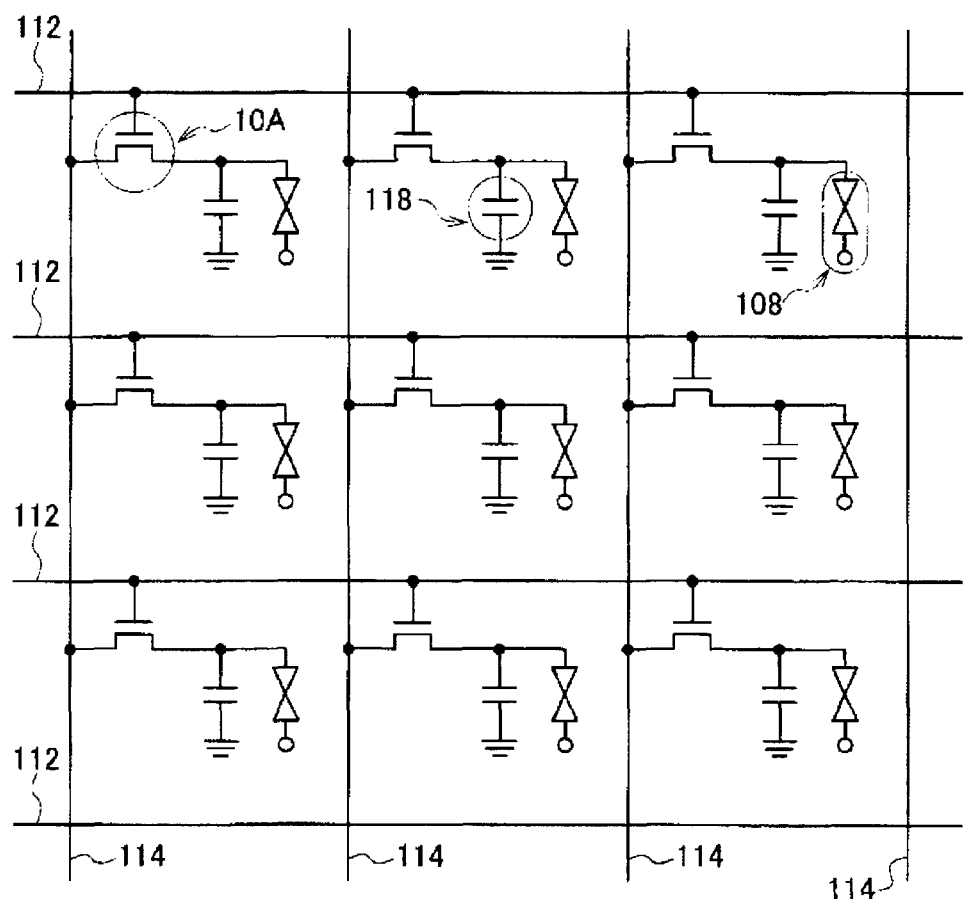
FIG. 5 is a schematic structural drawing of the electrical wiring of the liquid crystal display device shown in FIG. 4.

A schematic sectional view of a portion of a liquid crystal display device that is an embodiment of the electro-optical device of the present invention is shown in FIG. 4, and a schematic structural drawing of the electrical wiring thereof is shown in FIG. 5.

As shown in FIG. 4, a liquid crystal display device 100 of the present embodiment has the TFT 10A that has a top gate structure and is a top contacting type and is shown in FIG. 1A, a liquid crystal layer 108 that is nipped between a pixel lower electrode 104 and an opposing upper electrode 106 thereof on the gate electrode 24 that is protected by a passivation layer 102 of the TFT 10A, and an RGB color filter 110 that is for generating different colors in accordance with the respective pixels, and is structured so as to have polarization plates 112a, 112b on the substrate 12 side of the TFT 10A and on the RGB color filter 110, respectively.

Further, as shown in FIG. 5, the liquid crystal display device 100 of the present embodiment has plural gate lines 112 that are parallel to one another, and data lines 114 that are parallel to one another and intersect the gate lines 112. Here, the gate lines 112 and the data lines 114 are electrically insulated. The TFTs 10A are provided in vicinities of the intersecting portions of the gate lines 112 and the data lines 114.

The gate electrode 24 of the TFT 10A is connected to the gate line 112, and the source electrode 18 of the TFT 10A is connected to the data line 114. Further, the drain electrode 20 of the TFT 10A is connected to the pixel lower electrode 104 via a contact hole 116 (an electric conductor is embedded in the contact hole 116) that is provided in the gate insulating film 22. This pixel lower electrode 104, together with the opposing upper electrode 106 that is grounded, structures a capacitor 118.

The liquid crystal device of the present embodiment shown in FIG. 4 has the TFT 10A that has a top gate structure. However, the TFT that is used in the liquid crystal device that is the display device of the present invention is not limited to a top gate structure, and may be a TFT having a bottom gate structure.

At the TFT that is fabricated in accordance with the present invention, the generation of heat at the time of driving can be reduced. Therefore, the stability and reliability are extremely high, and thus, the TFT is suited to the manufacturing of a large-screen liquid crystal display device.

Further, the TFT, that has a sufficient characteristic, can be fabricated by annealing processing at a low temperature, and therefore, a resin substrate (plastic substrate) can be used as the substrate. Accordingly, in accordance with the present invention, a liquid crystal display device that is uniform over a large surface area and is stable and flexible can be provided.

5. Organic EL Display Device

Figure 6:
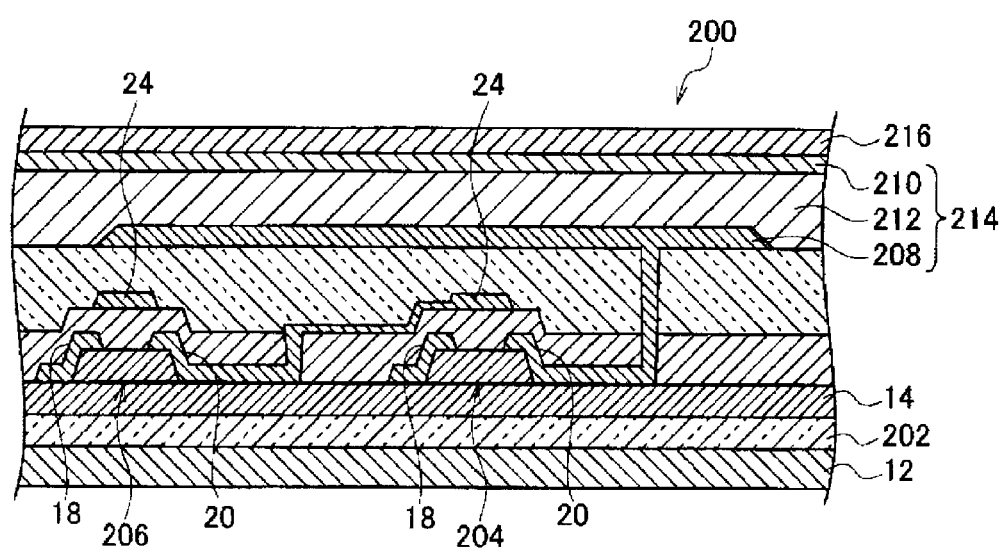
FIG. 6 is a schematic sectional view of a portion of an active matrix organic EL display device that is an embodiment of the electro-optical device of the present invention.
Figure 7:
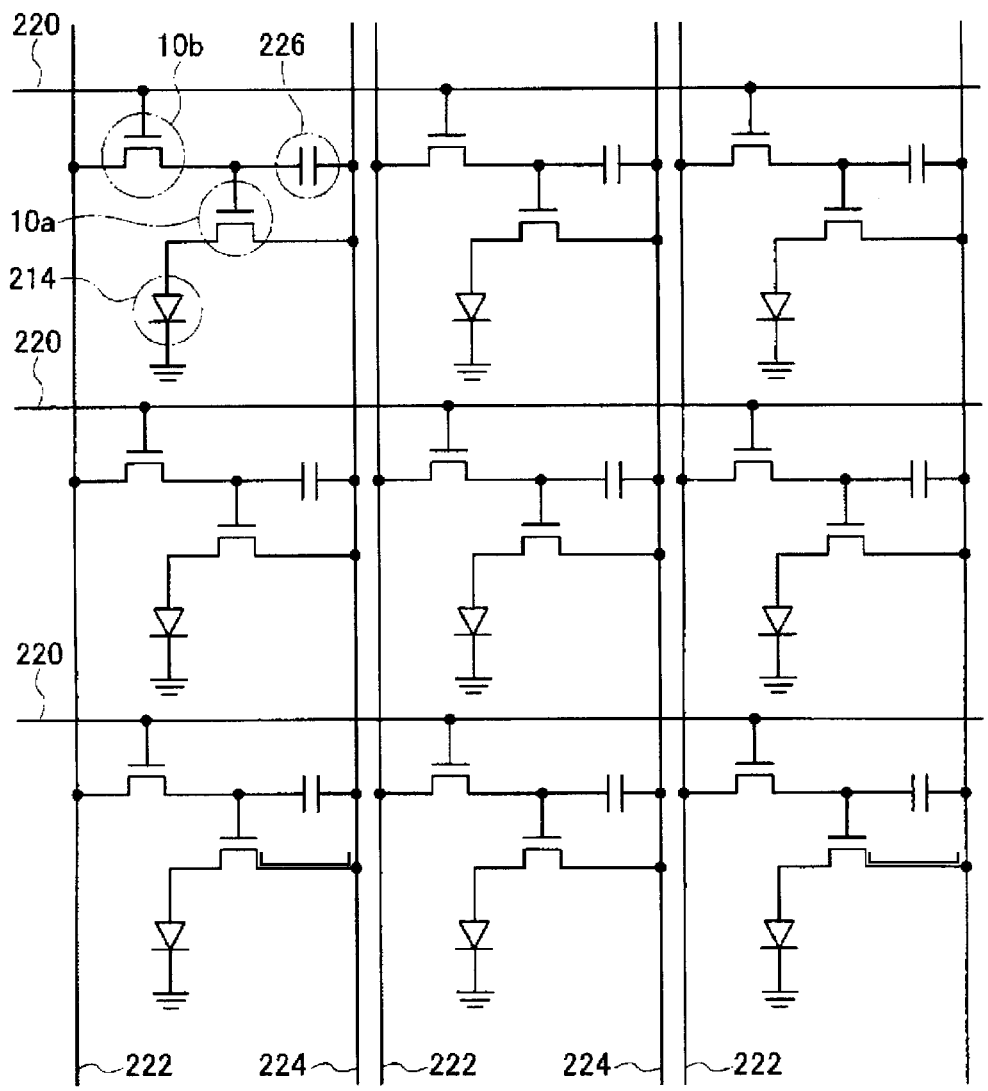
FIG. 7 is a schematic structural drawing of the electrical wiring of the electro-optical device shown in FIG. 6.

A schematic sectional view of a portion of an active-matrix organic EL display device that is an embodiment of the electro-optical device of the present invention is shown in FIG. 6, and a schematic structural drawing of the electrical wiring thereof is shown in FIG. 7.

There are two types of methods for driving an organic EL display device, which are a simple matrix method and an active matrix method. The simple matrix method has the merit that the display device can be manufactured at a low cost, but, because the pixels are made to emit light by selecting the scan lines one-by-one, the number of scan lines and the light-emitting time per scan line are inversely proportional. Therefore, it becomes difficult to increase the definition of the display device and make the display device have a large screen. In the active matrix method, because the transistors and capacitors are formed per pixel, the manufacturing cost is high, but the active matrix method does not have the problem of not being able to increase the number of scan lines as in the simple matrix method, and therefore, is suited to making the display device have higher definition and have a large screen.

An active-matrix organic EL display device 200 of the present embodiment is structured such that the TFT 10A, that has a top gate structure and is shown in FIG. 1A, is provided as a TFT 204 for driving and a TFT 206 for switching on the substrate 12 that has a passivation layer 202, and so as to have, above these TFTs 204 and 206, an organic EL light-emitting element 214 that is formed from an organic light-emission layer 212 that is sandwiched between a lower electrode 208 and an upper electrode 210, and such that the upper surface as well is protected by a passivation layer 216.

Further, as shown in FIG. 7, the organic EL display device 200 of the present embodiment has plural gate lines 220 that are parallel to one another, and data lines 222 and driving lines 224 that are parallel to one another and that intersect the gate lines 220. Here, the gate lines 220, and the data lines 222 and driving lines 224, are electrically insulated. The gate electrode 24 of a TFT 10Ab for switching is connected to the gate line 220, and the source electrode 18 of the TFT 10Ab for switching is connected to the data line 222. Further, the drain electrode 20 of the TFT 10Ab for switching is connected to the gate electrode 24 of the TFT 10A for driving, and, by using a capacitor 226, a TFT 10a for driving is maintained in an on state. The source electrode 18 of the TFT 10a for driving is connected to the driving line 224, and the drain electrode 20 is connected to the organic EL light-emitting element 214.

The organic EL device of the present embodiment that is shown in FIG. 6 is provided with the TFTs 10a and 10b that have top gate structures. However, the TFTs that are used in the organic EL device that is a display device of the present invention are not limited to top gate structures, and may be TFTs having bottom gate structures.

At the TFT that is fabricated in accordance with the present invention, the generation of heat at the time of driving can be reduced. Therefore, the stability and reliability are extremely high, and thus, the TFT is suited to the manufacturing of a large-screen organic EL display device.

Further, the TFT, that has a sufficient characteristic, can be fabricated by annealing processing at a low temperature, and therefore, a resin substrate (plastic substrate) can be used as the substrate. Accordingly, in accordance with the present invention, an organic EL display device that is uniform over a large surface area and is stable and flexible can be provided.

Note that the organic EL display device shown in FIG. 6 may be a top-emission-type in which the upper electrode 210 is a transparent electrode, or may be a bottom-emission-type by making the lower electrode 208 and the respective electrodes of the TFTs be transparent electrodes.

6. X-Ray Sensor

Figure 8:
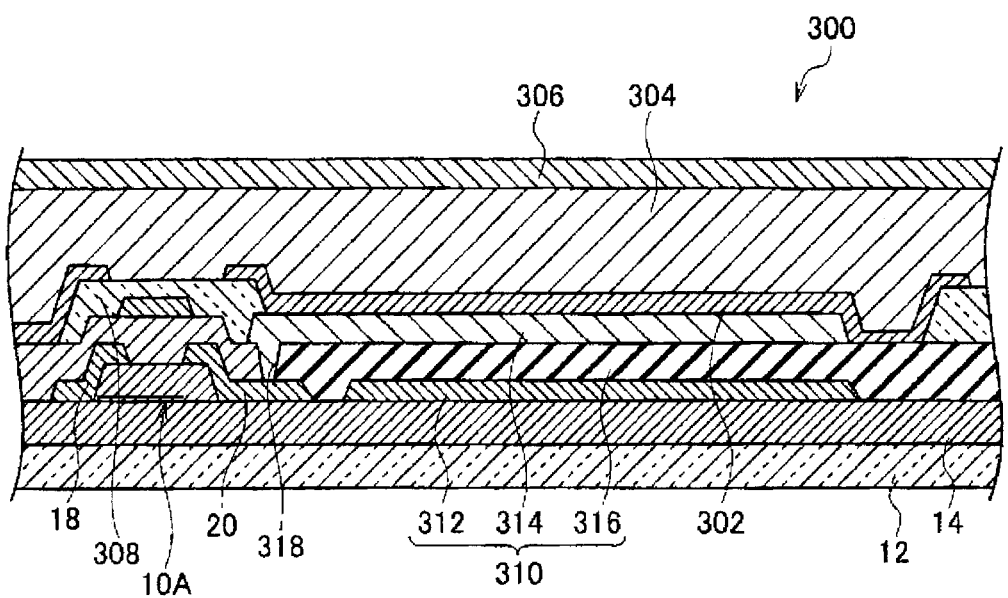
FIG. 8 is a schematic sectional view of a portion of an X-ray sensor that is an embodiment of a sensor of the present invention.
Figure 9:
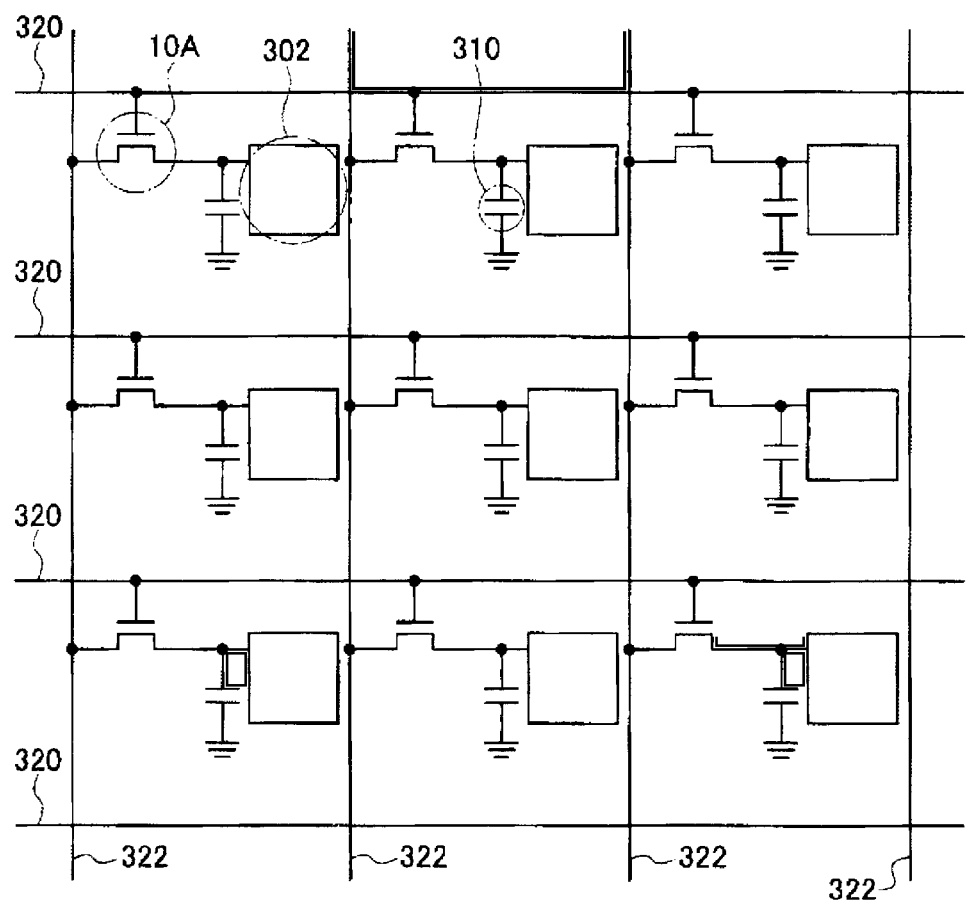
FIG. 9 is a schematic structural drawing of the electrical wiring of the sensor shown in FIG. 8.

A schematic sectional view of a portion of an X-ray sensor that is an embodiment of the sensor of the present invention is shown in FIG. 8, and a schematic structural drawing of the electrical wiring thereof is shown in FIG. 9.

FIG. 8 is a schematic sectional view in which a portion of an X-ray sensor array is enlarged more concretely. An X-ray sensor 300 of the present embodiment is structured to have the TFT 10A and a capacitor 310 that are formed on the substrate 12, an electrode 302 for charge collection that is formed on the capacitor 310, an X-ray conversion layer 304, and an upper electrode 306. A passivation film 308 is provided on the TFT 10A.

The capacitor 310 is a structure in which an insulating film 316 is sandwiched between a lower electrode 312 for the capacitor and an upper electrode 314 for the capacitor. The upper electrode 314 for the capacitor is connected to either one of the source electrode 18 and the drain electrode 20 of the TFT 10A (in FIG. 8, the drain electrode 20) via a contact hole 318 that is provided in the insulating film 316.

The electrode 302 for charge collection is provided on the upper electrode 314 for the capacitor at the capacitor 310, and contacts the upper electrode 314 for the capacitor.

The X-ray conversion layer 304 is a layer that is formed from amorphous selenium, and is provided so as to cover the TFT 10A and the capacitor 310.

The upper electrode 306 is provided on the X-ray conversion layer 304, and contacts the X-ray conversion layer 304.

As shown in FIG. 9, the X-ray sensor 300 of the present embodiment has plural gate lines 320 that are parallel to one another, and plural data lines 322 that are parallel to one another and intersect the gate lines 320. Here, the gate lines 320 and the data lines 322 are electrically insulated. The TFTs 10A are provided in vicinities of the intersecting portions of the gate lines 320 and the data lines 322.

The gate electrode 24 of the TFT 10A is connected to the gate line 320, and the source electrode 18 of the TFT 10A is connected to the data line 322. Further, the drain electrode 20 of the TFT 10A is connected to the electrode 302 for charge collection, and moreover, this electrode 302 for charge collection is connected to the capacitor 310.

In the X-ray sensor 300 of the present embodiment, X-rays are irradiated from the upper portion (the upper electrode 306 side) in FIG. 8, and electron-hole pairs are generated at the X-ray conversion layer 304. By applying a high electric field by the upper electrode 306 to this X-ray conversion layer 304, the generated charges are accumulated at the capacitor 310, and are read-out by the TFTs 10A being scanned successively.

At the X-ray sensor 300 of the present embodiment, the generation of heat at the time of driving can be reduced. Therefore, the stability and reliability are high, and thus, the X-ray sensor 300 is suited to increasing screen sizes. Further, in a case in which the active layer 16 is structured of IGZO, the mobility is high, and therefore, the sensitivity characteristic is excellent, and images of a wide dynamic range are obtained when the X-ray sensor 300 is used in an X-ray digital imaging device. In particular, the X-ray digital imaging device of the present embodiment is not a device at which only static imaging is possible, and is suited to use as an X-ray digital imaging device at which fluoroscopy by video images and capturing of a static image can be carried out by a single device. Moreover, in cases in which the active layer 16 at the TFT 10A is amorphous, images having excellent uniformity are obtained.

Note that the X-ray sensor of the present embodiment that is shown in FIG. 8 is provided with the TFT that has a top gate structure, but the TFT that is used in the sensor of the present invention is not limited to a top gate structure, and may be a TFT having a bottom gate structure.

Examples

Examples are described hereinafter, but the present invention is not limited in any way by these Examples.

(Verification of Effects, on TFT, of Thermal Conductivity of Substrate)

Bottom gate, top-contacting-type TFTs were fabricated respectively on a glass substrate and a silicon substrate having different thermal conductivities (glass substrate: thermal conductivity $N_{sub}$=1 W/mK, silicon substrate: thermal conductivity $N_{sub}$=100 W/mK).

The active layer was made to be IGZO (film thickness 50 nm) having a composition ratio of In:Ga:Zn=1.0:1.0:0.9. Mo (film thickness 40 nm) was used for the source, drain (film thickness 100 nm) and gate electrodes, and $SiO_2$ (film thickness 200 nm) was used for the insulating layer. Photolithography and wet etching were used in the patterning. Oxalic acid was used for the etching of the IGZO, phosphoric, nitric and acetic acids were used for the etching of the Mo electrodes, and buffered hydrofluoric acid was used for the etching of the insulating layer. TSMR9000-LB was used as the resist, and a solution of 5% TMAH was used as the developing liquid. At an element of an element size of L/W=5/25 (μm/μm), a temperature map (substrate temperature 50° C.) at the time of element driving in a case in which the driving conditions were Vg=20V and Vds=50 V, was measured. InfraScope II manufactured by Nippon Barnes was used as the measurement device.

Figure 10A:
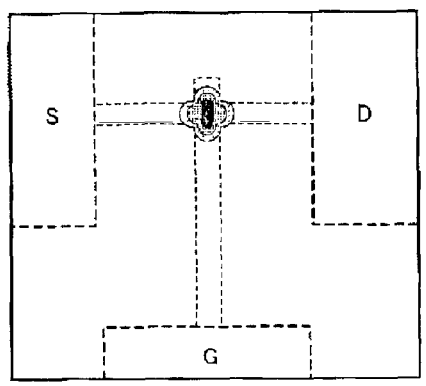
FIG. 10A is a drawing showing the results of measuring temperature maps (substrate temperature 50° C.) at the time of element driving, especially in the case of a glass substrate.
Figure 10B:
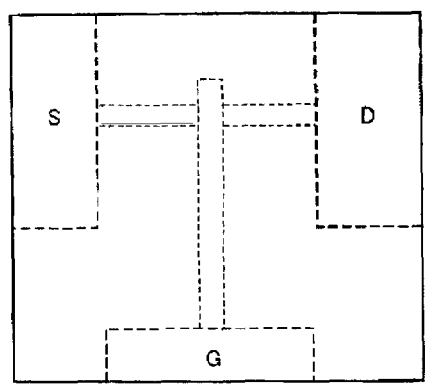
FIG. 10B is a drawing showing the results of measuring temperature maps (substrate temperature 50° C.) at the time of element driving, especially in the case of a silicon substrate.

FIGS. 10A and 10B are drawings showing the results of measuring temperature maps (substrate temperature 50° C.) at the time of element driving, where FIG. 10A shows a temperature map in the case of a glass substrate, and FIG. 10B shows a temperature map in the case of a silicon substrate.

As shown in FIGS. 10A and 10B, as a result of measuring the temperature maps, it was observed that there was a rise in temperature of greater than or equal to 100° C. at the glass substrate whose thermal conductivity was low. Further, hardly any rise in temperature at all was observed at the silicon substrate whose thermal conductivity was high. It was found that, as the temperature rises, the drain current Id decreases.

Figure 11:
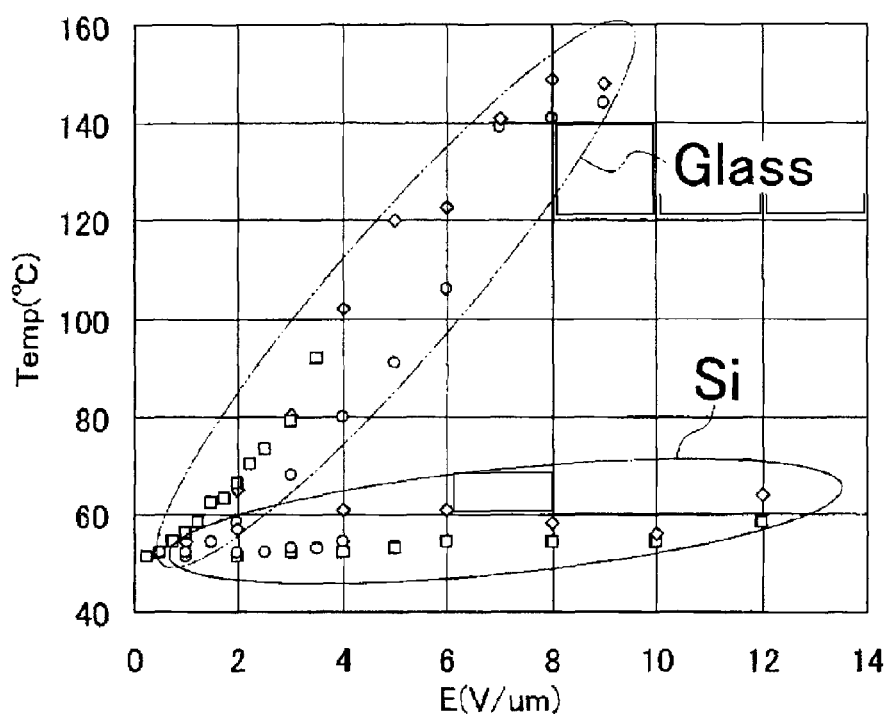
FIG. 11 is a drawing that plots heat generation temperature, with gate voltage Vg being fixed at Vg=20 V and field E applied between S-D being a variable.

FIG. 11 is a drawing that plots heat generation temperature, with gate voltage Vg being fixed at Vg=20 V and field E applied between S-D being a variable.

As shown in FIG. 11, it can be understood that a difference in heat generation temperatures arises in accordance with a difference in thermal conductivities of substrates.

The effects that heat generation has on the TFT characteristic are described next.

Figure 12:
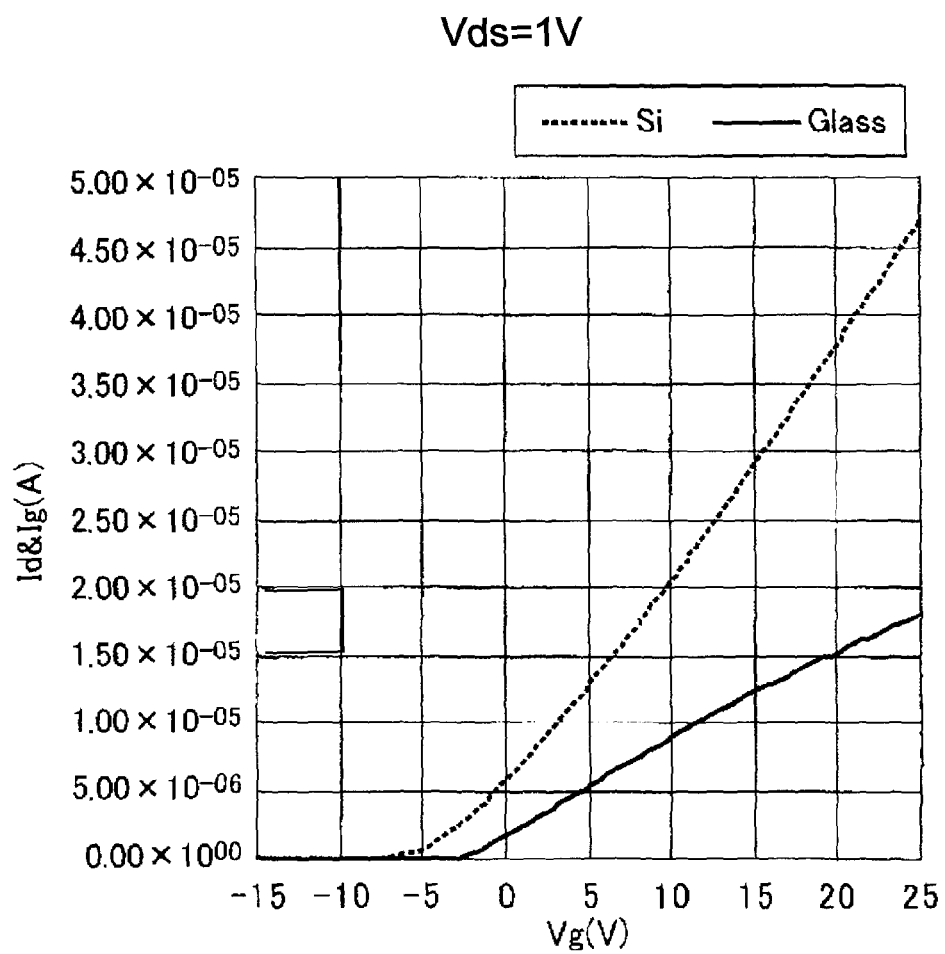
FIG. 12 is a drawing that plots the relationship between Id and Ig, and Vg, in a case in which Vds=1 V.
Figure 13:
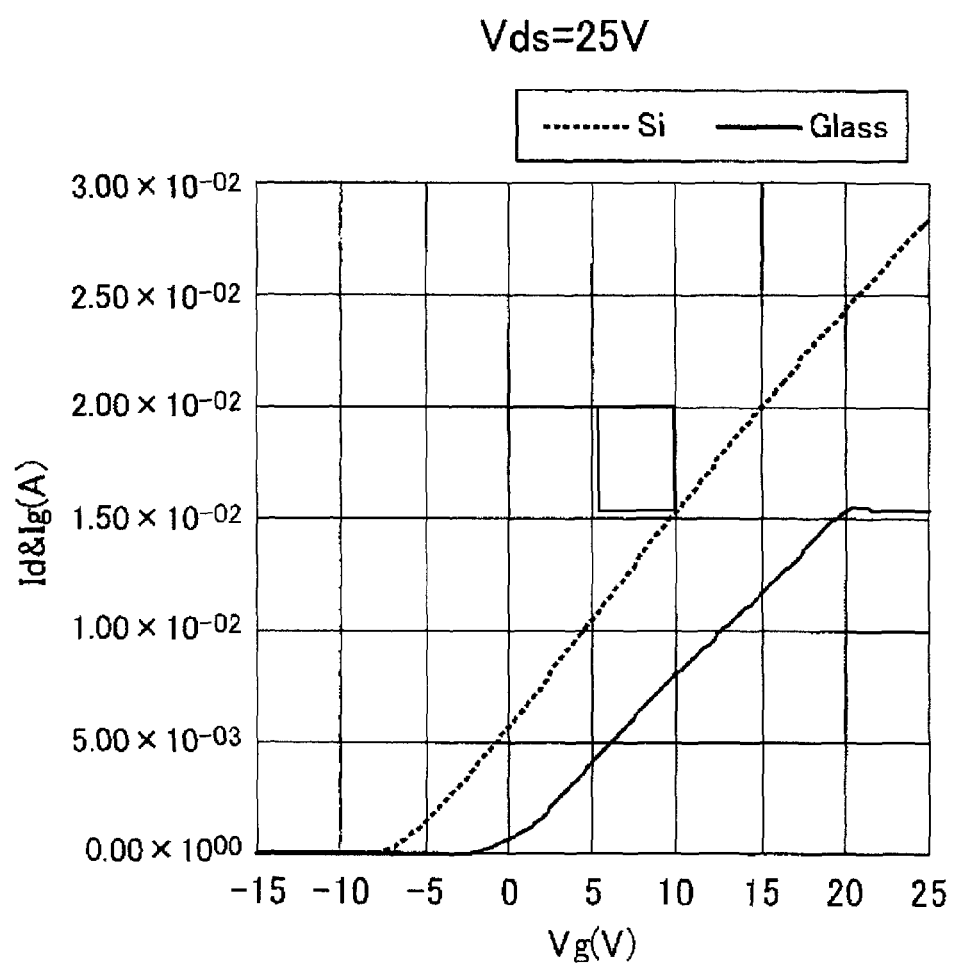
FIG. 13 is a drawing that plots the relationship between Id and Ig, and Vg, in a case in which Vds=25 V.

FIG. 12 is a drawing that plots the relationship between Id and Ig, and Vg, in a case in which Vds=1 V. FIG. 13 is a drawing that plots the relationship between Id and Ig, and Vg, in a case in which Vds=25 V.

As shown in FIG. 12, in a case in which the driving condition is Vds=1 V, a large difference in the TFT characteristic is not confirmed with regard to the difference in the thermal conductivities. On the other hand, as shown in FIG. 13, in a case in which the driving condition is Vds=25 V, it was confirmed that abnormalities arise in the region of greater than or equal to Vg=20 V in the Vg-ID curves of the TFTs.

Figure 14:
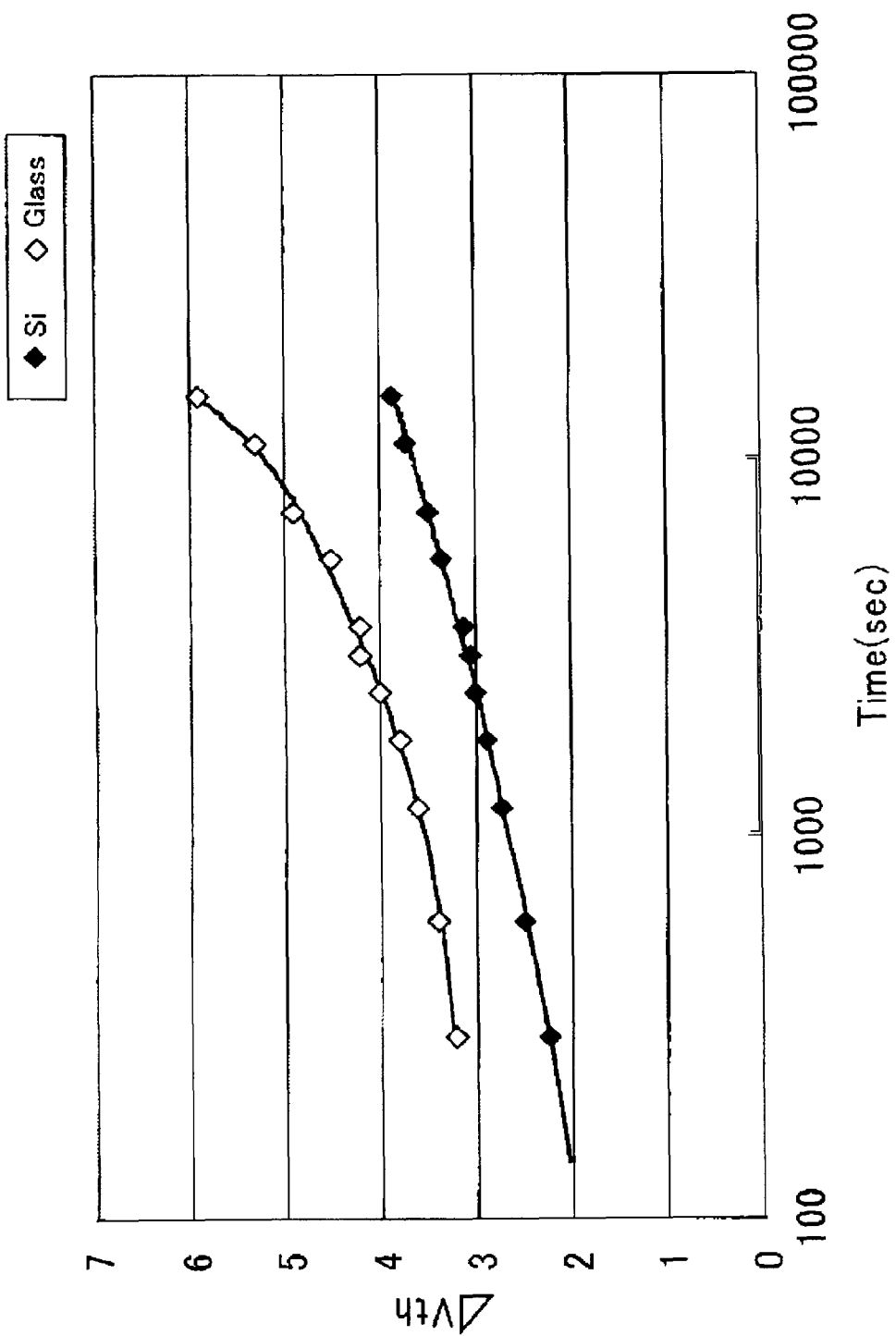
FIG. 14 is a drawing showing the relationship between driving time and threshold value shift $\Delta$Vth, in a case in which the driving condition is Vds=Vg=20 V, at an element whose element size is L/W=5/100 (μm/μm)

FIG. 14 is a drawing showing the relationship between driving time and threshold value shift ΔVth, in a case in which the driving condition is Vds=Vg=20 V, at an element whose element size is L/W=5/100 (μm/μm).

As shown in FIG. 14, it can be understood that, as the driving time (heat generation time) becomes longer, the value of the threshold shift that expresses reliability increases. Further, it can be understood that, at the glass substrate whose thermal conductivity is low, the increase in the threshold shift is exhibited more markedly.

It is predicted that the above-described effects are even greater in substrates having a low thermal conductivity, such as resin substrates and the like. Here, by using the following method, a heat diffusion layer was provided at a TFT, and further, suppressing of the above-described effects was tested by prescribing the thermal conductivity thereof.

(Determination of Thermal Conductivity of Heat Diffusion Layer)

Simulation in accordance with the finite element method was carried out by using Femtet manufactured by Murata Software, and designing of the heat diffusion layer was carried out.

Figure 15A:
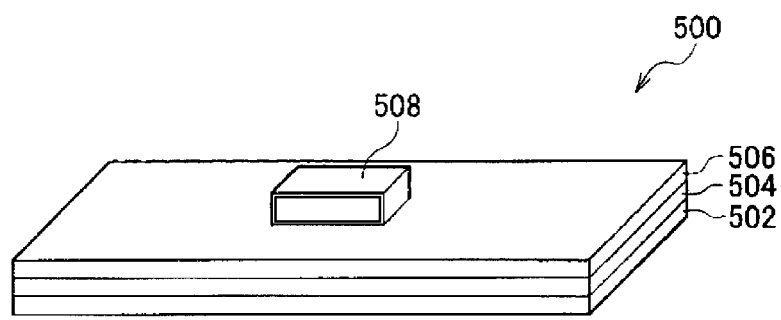
FIG. 15A is a drawing illustrating a structural body that is used in simulation in a perspective view.
Figure 15B:
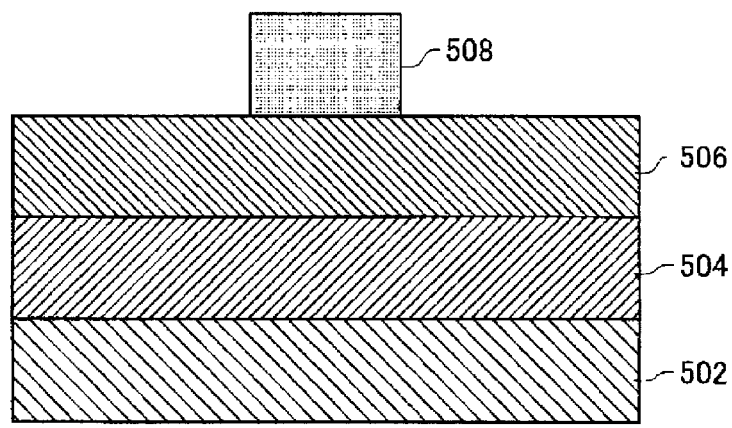
FIG. 15B is a drawing illustrating a structural body that is used in simulation in a cross-sectional view.
Figure 16:
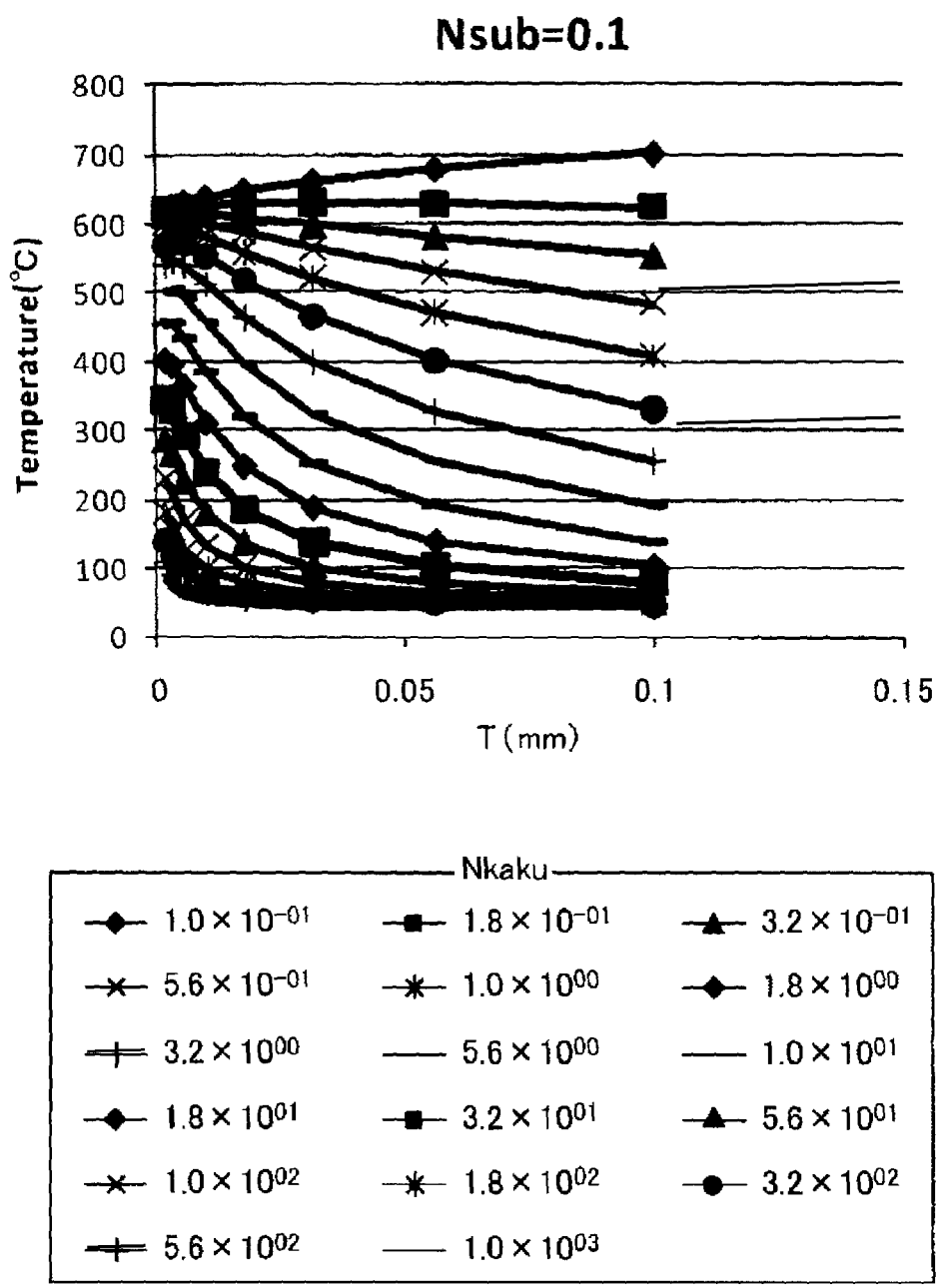
FIG. 16 is a drawing showing results of simulation, and is a graph showing the relationship ($N_{kaku} \geq N_{sub}$) with temperature when $N_{sub}$=0.1 and $N_{kaku}$ and T are parameters.
Figure 17:
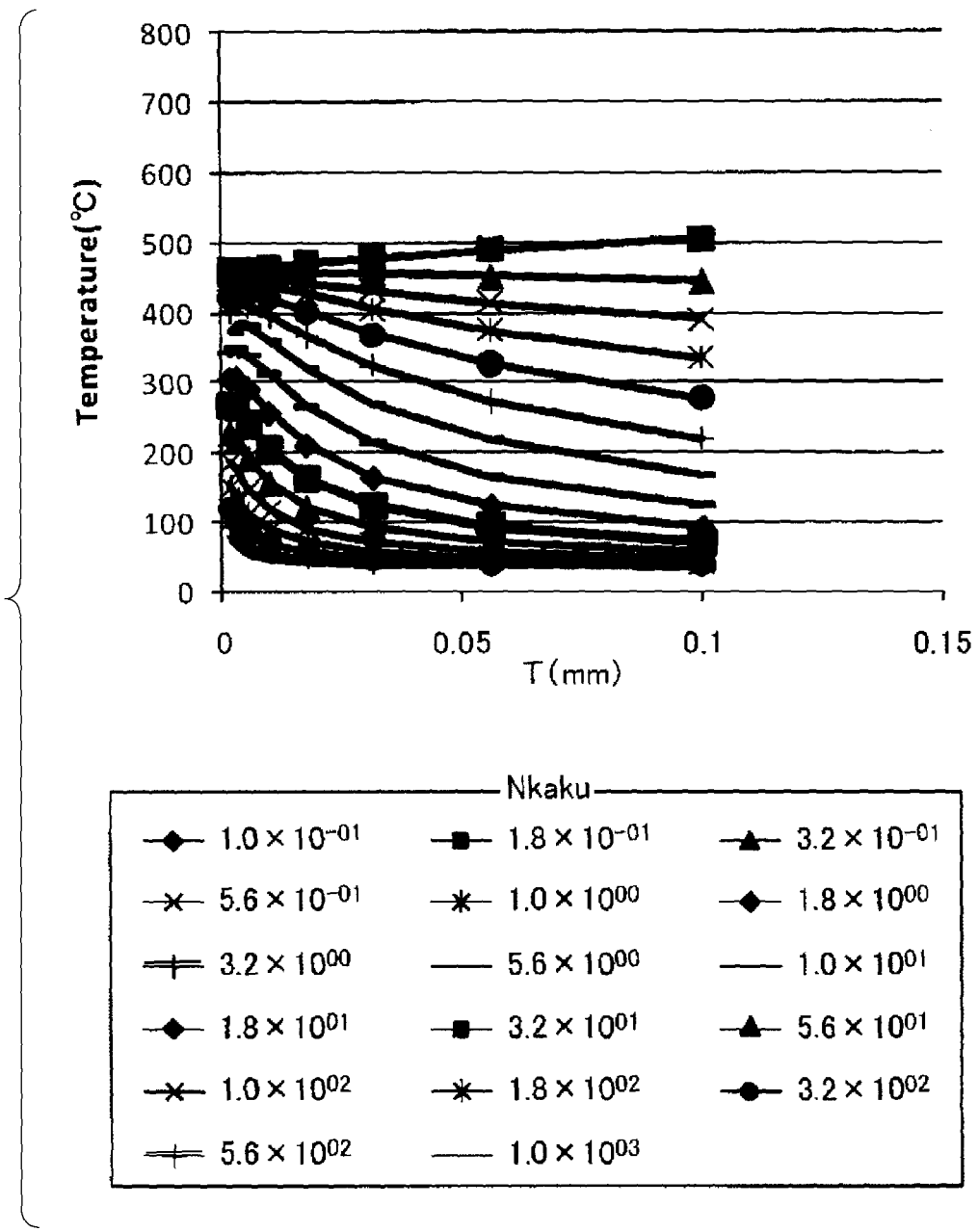
FIG. 17 is a drawing showing results of simulation, and is a graph showing the relationship ($N_{kaku} \geq N_{sub}$) with temperature when $N_{sub}$=0.18 and $N_{kaku}$ and T are parameters.
Figure 18:
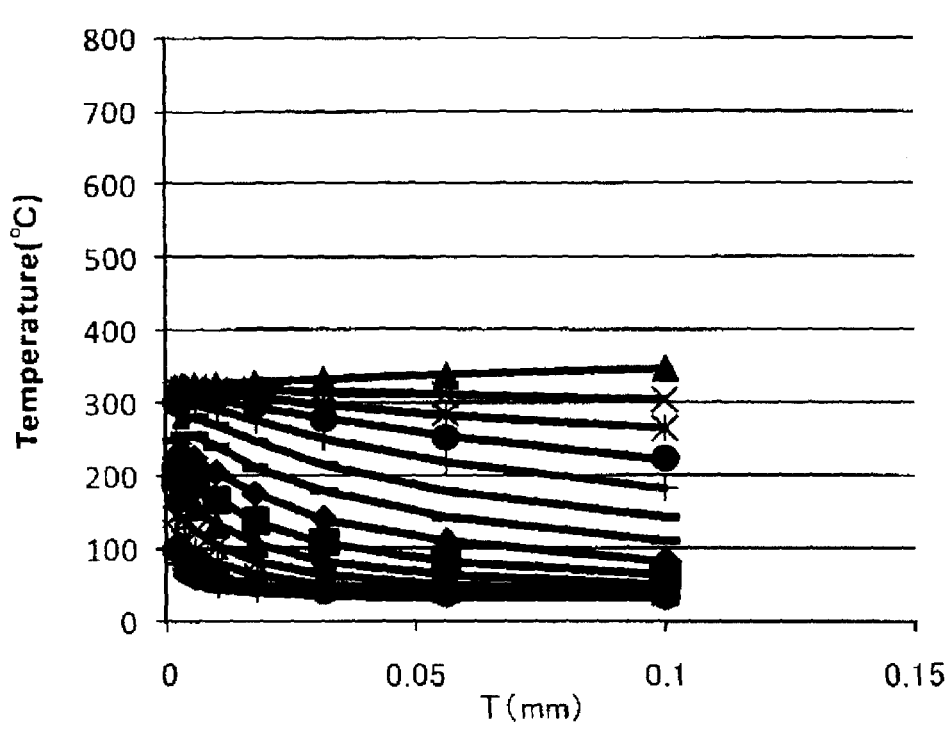
FIG. 18 is a drawing showing results of simulation, and is a graph showing the relationship ($N_{kaku} \geq N_{sub}$) with temperature when $N_{sub}$=0.32 and $N_{kaku}$ and T are parameters.
Figure 19:
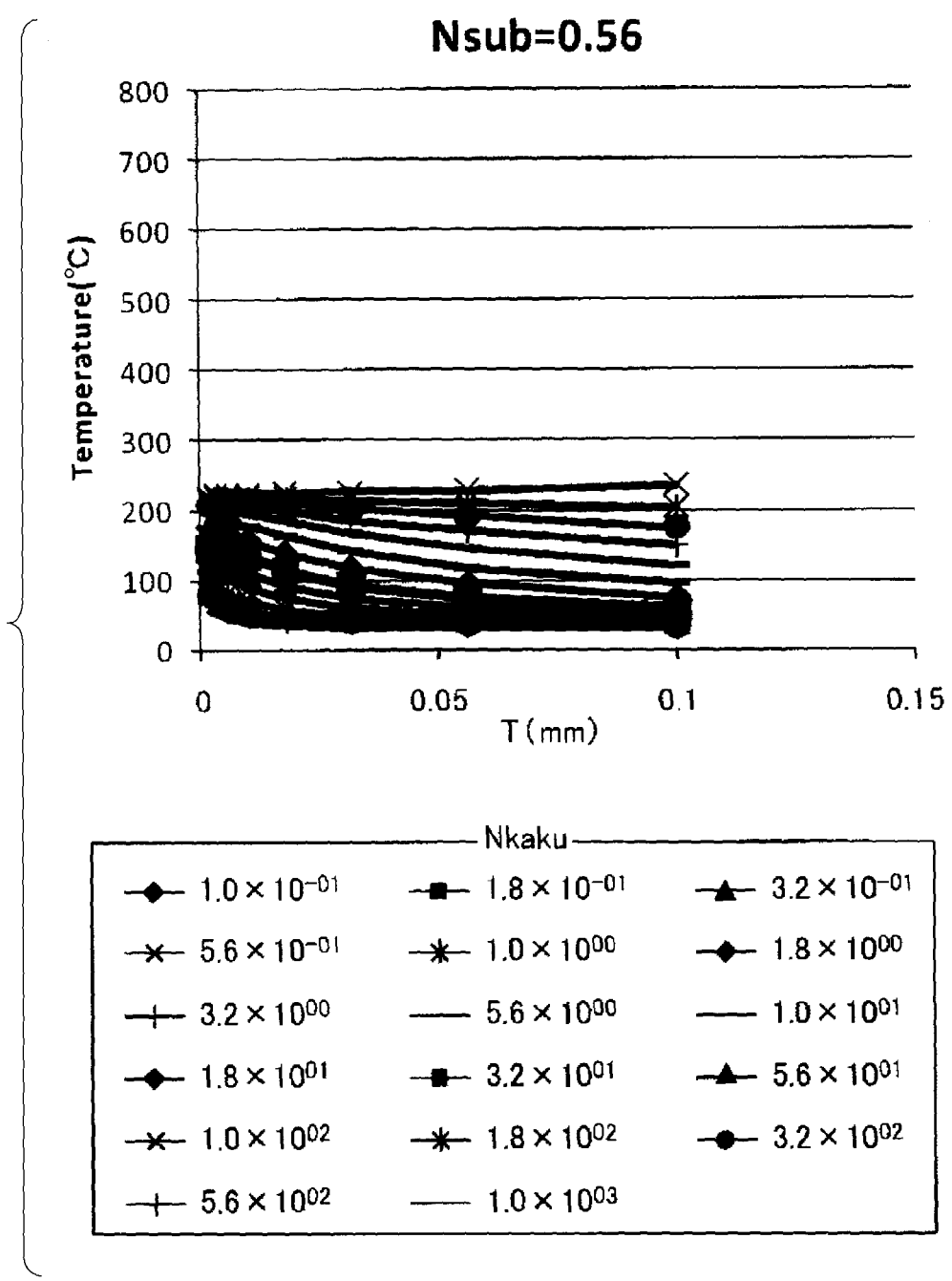
FIG. 19 is a drawing showing results of simulation, and is a graph showing the relationship ($N_{kaku} \geq N_{sub}$) with temperature when $N_{sub}$=0.56 and $N_{kaku}$ and T are parameters.
Figure 20:
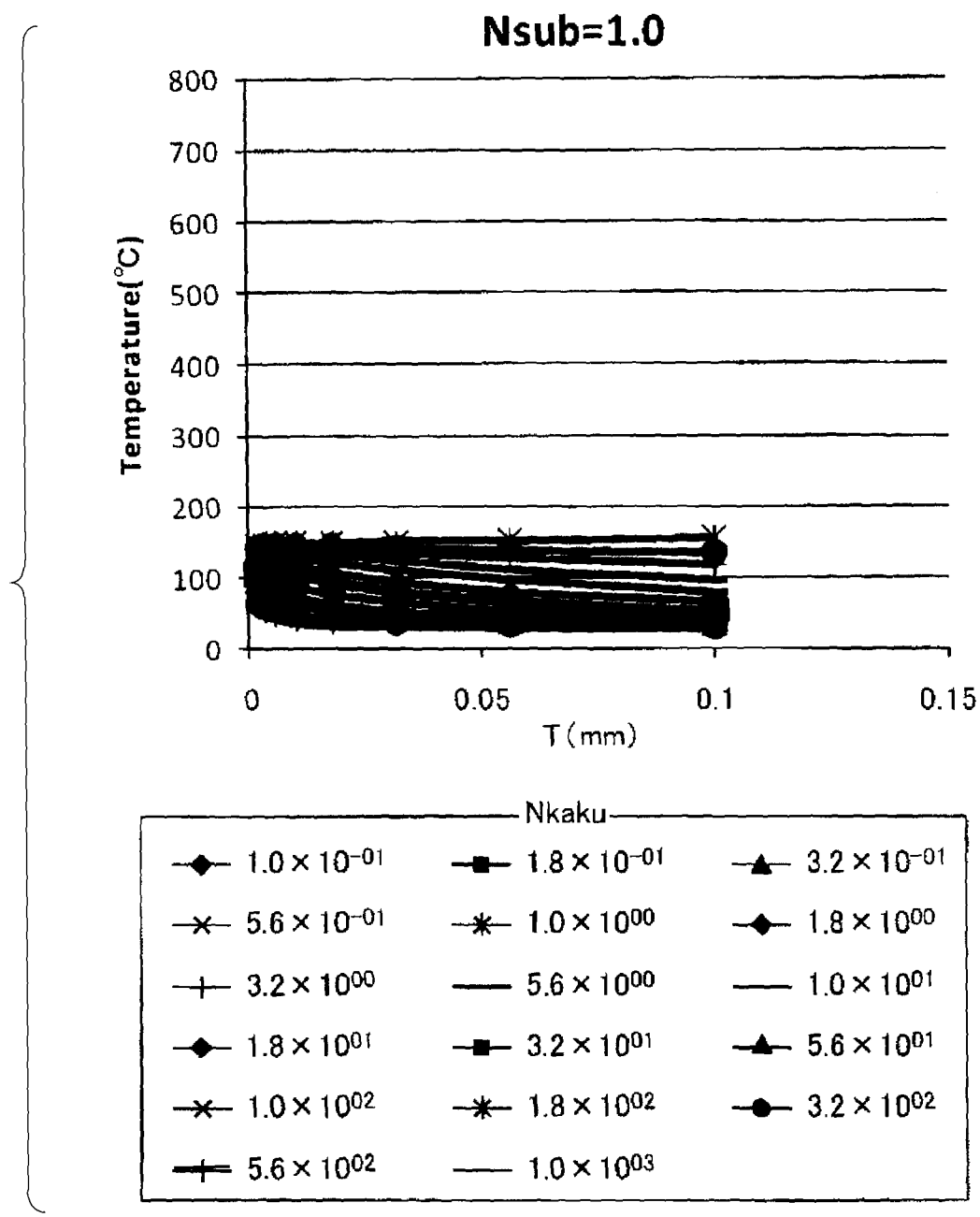
FIG. 20 is a drawing showing results of simulation, and is a graph showing the relationship ($N_{kaku} \geq N_{sub}$) with temperature when $N_{sub}$=0.1 and $N_{kaku}$ and T are parameters.
Figure 21:
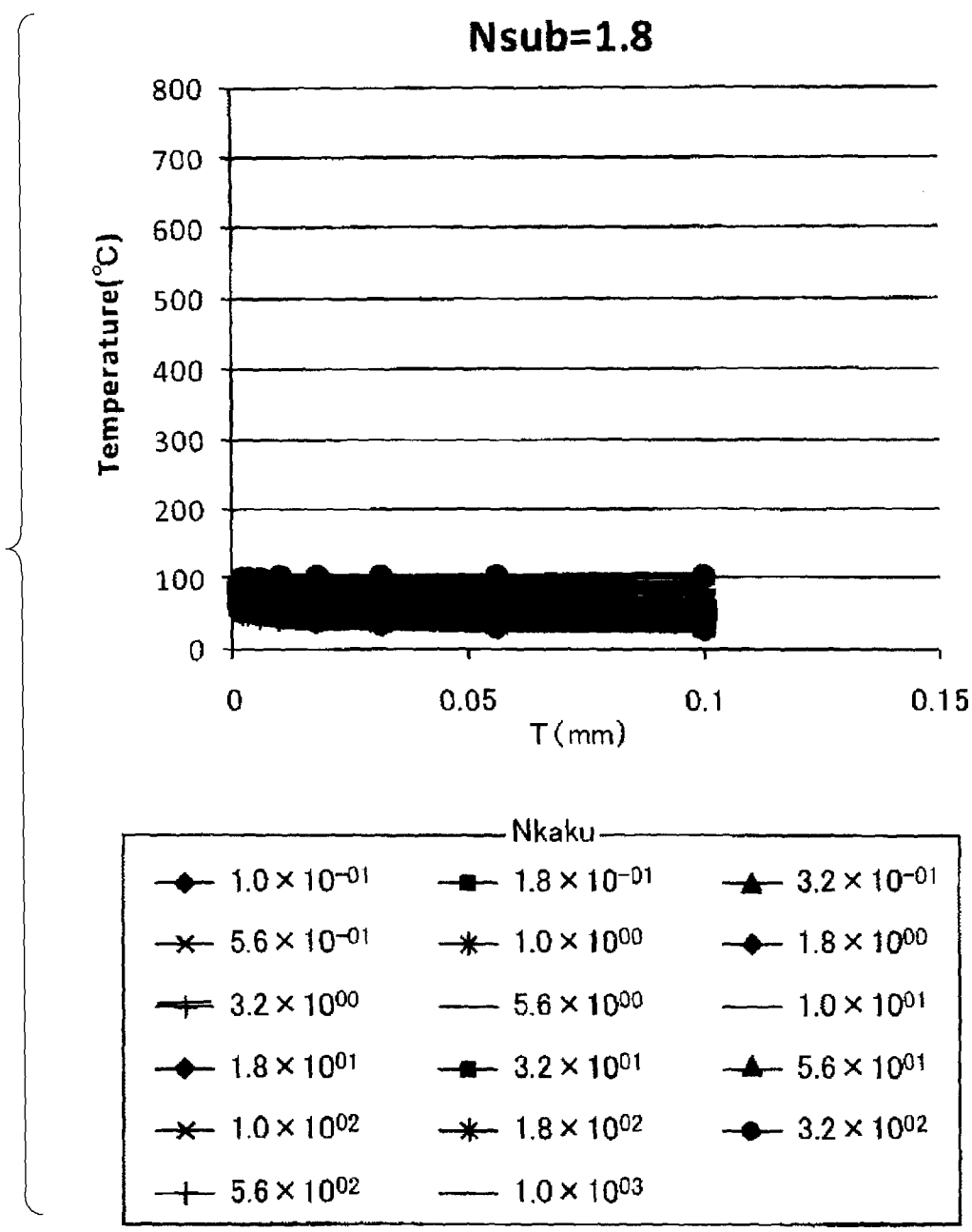
FIG. 21 is a drawing showing results of simulation, and is a graph showing the relationship ($N_{kaku} \geq N_{sub}$) with temperature when $N_{sub}$=1.0 and $N_{kaku}$ and T are parameters.
Figure 22:
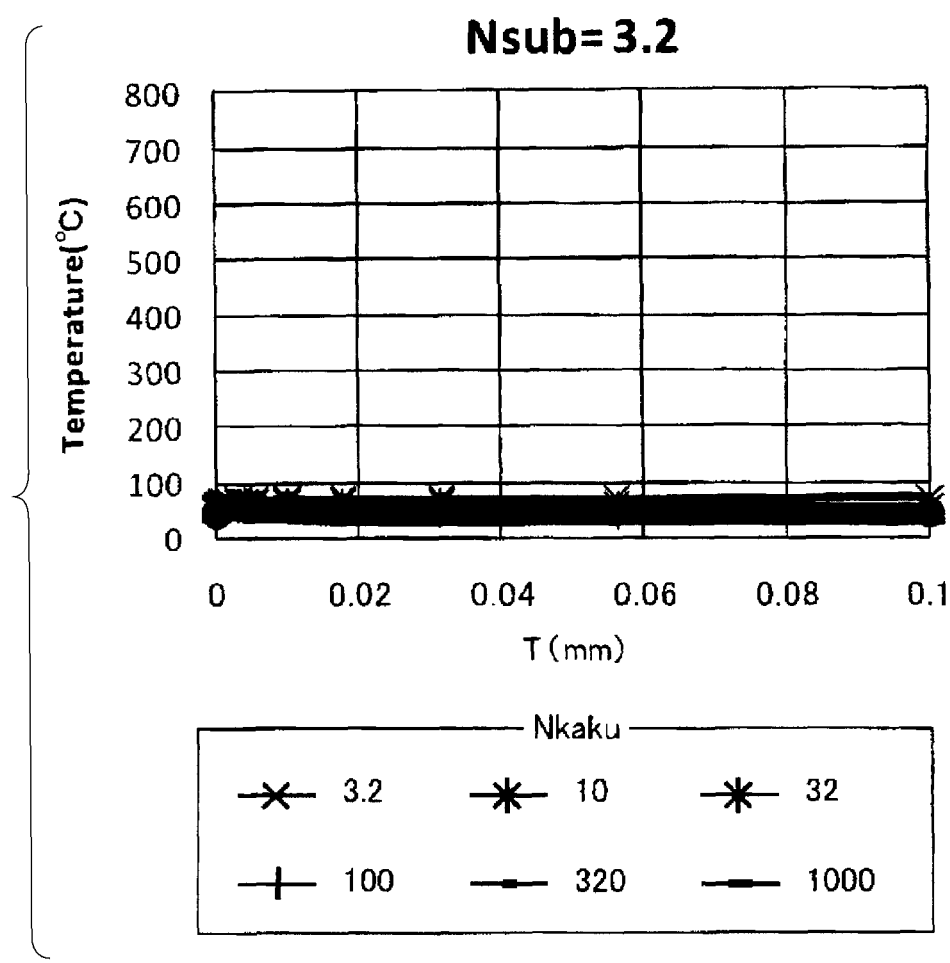
FIG. 22 is a drawing showing results of simulation, and is a graph showing the relationship ($N_{kaku} \geq N_{sub}$) with temperature when $N_{sub}$=1.8 and $N_{kaku}$ and T are parameters.
Figure 23:
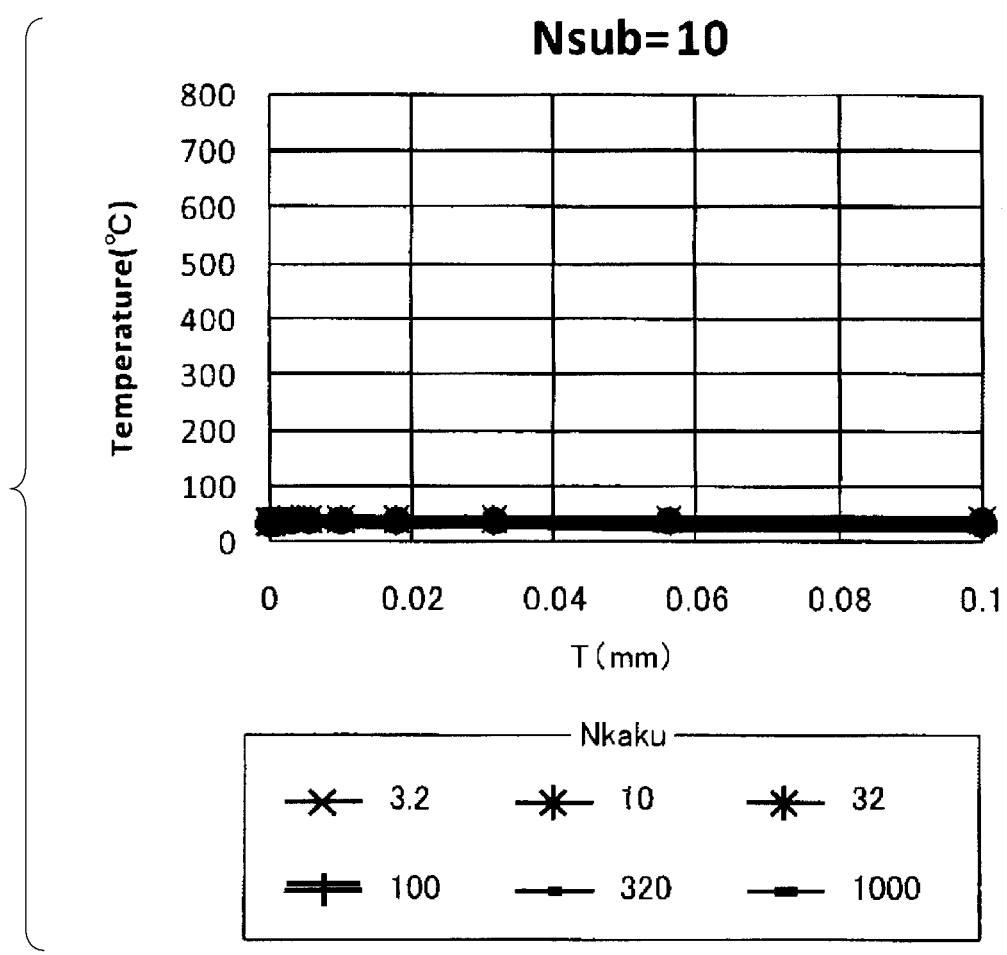
FIG. 23 is a drawing showing results of simulation, and is a graph showing the relationship ($N_{kaku} \geq N_{sub}$) with temperature when $N_{sub}$=3.2 and $N_{kaku}$ and T are parameters.
Figure 24:
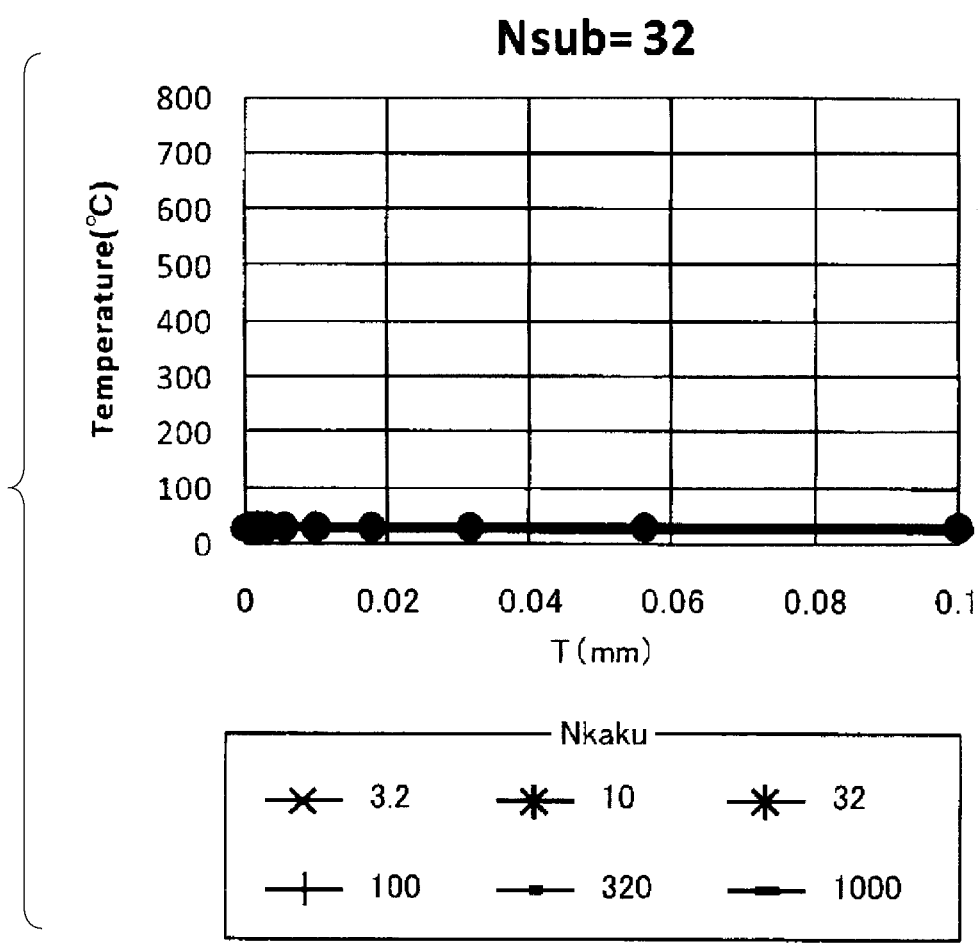
FIG. 24 is a drawing showing results of simulation, and is a graph showing the relationship ($N_{kaku} \geq N_{sub}$) with temperature when $N_{sub}$=32 and $N_{kaku}$ and T are parameters.
Figure 25:
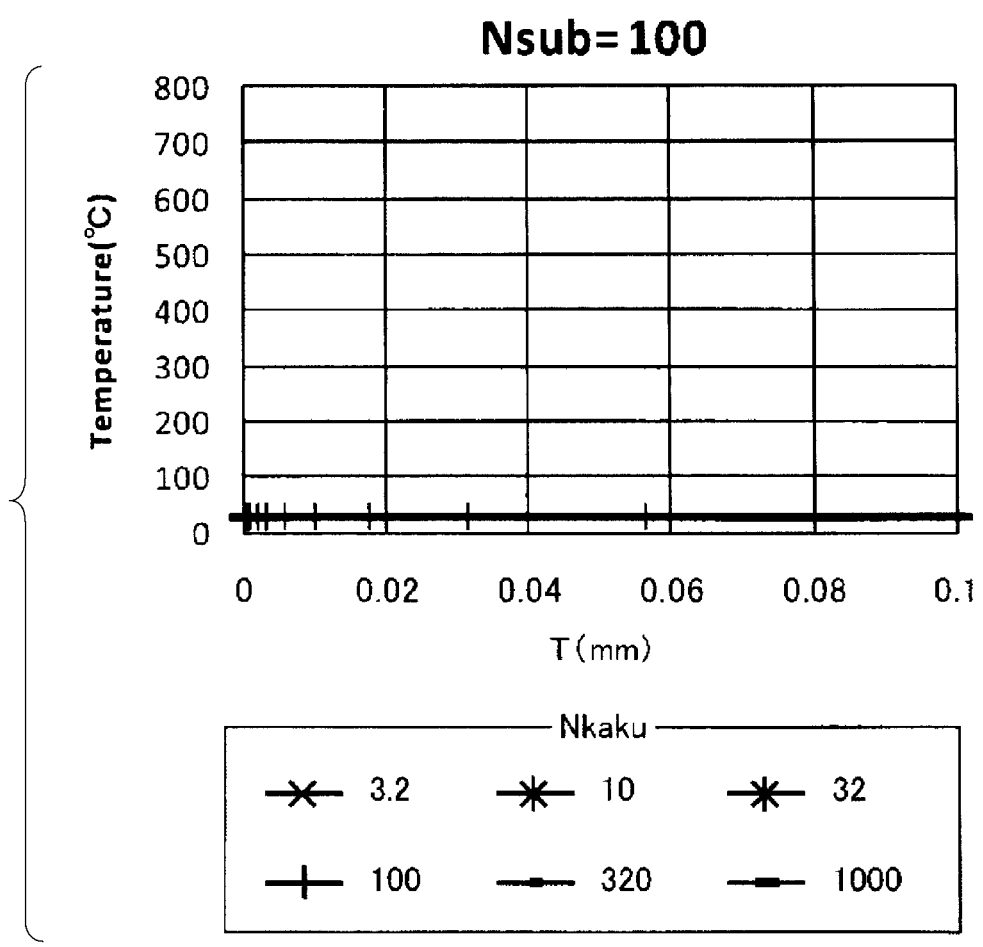
FIG. 25 is a drawing showing results of simulation, and is a graph showing the relationship ($N_{kaku} \geq N_{sub}$) with temperature when $N_{sub}$=100 and $N_{kaku}$ and T are parameters.
Figure 26:
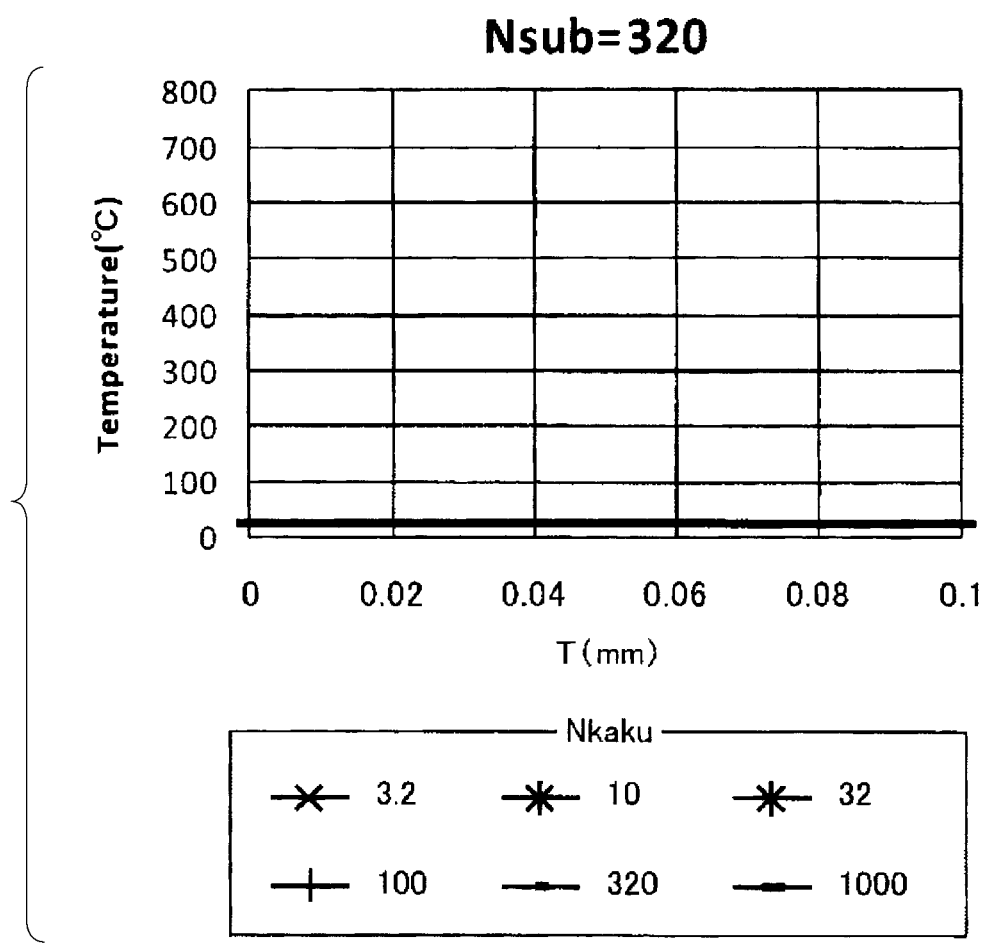
FIG. 26 is a drawing showing results of simulation, and is a graph showing the relationship ($N_{kaku} \geq N_{sub}$) with temperature when $N_{sub}$=320 and $N_{kaku}$ and T are parameters.
Figure 27:
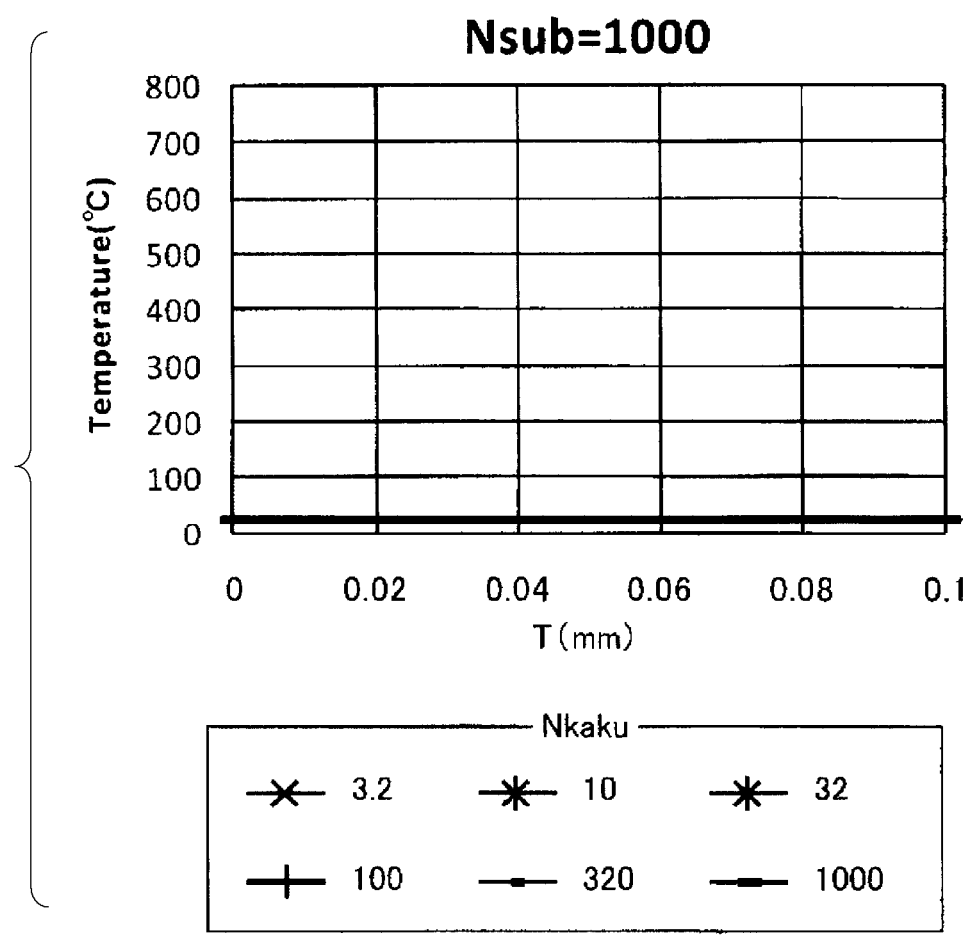
FIG. 27 is a drawing showing results of simulation, and is a graph showing the relationship ($N_{kaku} \geq N_{sub}$) with temperature when $N_{sub}$=1000 and $N_{kaku}$ and T are parameters.

FIGS. 15A and 15B are drawings illustrating a structural body that is used in the simulation, where FIG. 15A is a perspective view of the structural body, and FIG. 15B is a cross-sectional view of the structural body.

A structural body 500 of FIGS. 15A and 15B is a structure in which a heat diffusion layer 504 and an insulating layer 506 and a heat generating body 508 are layered in order on a substrate 502.

Further, in the designing of this heat diffusion layer, concretely, designing that was such that the heat generation temperature, at the time when the driving conditions are Vg=20 V and Vds=50 V, is less than 100° C. or less than 300° C., was carried out.

Further, in the designing, parametric analysis was carried out, and the maximum value of the heat generation temperature was extracted.

The parameters such as the boundary condition and the like were as follows.

Boundary condition: external boundary condition, natural convection
Mesh size: 0.4

Further, the conditions of the heat generating body 508 were as follows.
Size: 1×1×0.01 mm
Thermal conductivity: 10 W/mK
Heat generation amount: 0.4 W
Heat transfer: 20 W/m²/deg (heat generating body/insulating layer, boundary condition)

Further, the conditions of the insulating layer 506 were as follows.
Size: 10×10×0.001 mm
Thermal conductivity: 1 W/mK
Heat transfer: 15 W/m²/deg (insulating layer/heat diffusion layer, boundary condition)

Further, the conditions of the heat diffusion layer 504 were as follows.
Size: 10×10×T mm
Thermal conductivity: $N_{kaku}$ W/mK
Heat transfer: 10 W/m²/deg (insulating layer/heat diffusion layer, boundary condition)

Further, the conditions of the substrate 502 were as follows.
Size: 10×10×05 mm
Thermal conductivity: $N_{sub}$ W/mK
Substrate surface temperature: 25° C. (substrate/external boundary condition)

FIG. 16 through FIG. 27 are drawings showing results of the simulation, and are graphs showing the relationship ($N_{kaku} \geq N_{sub}$) with temperature when $N_{sub}$, $N_{kaku}$ and T are parameters. Note that, in the drawings, the maximum value of the heat generation temperature is plotted on the vertical axis, and thickness T of the heat diffusion layer 504 is shown on the horizontal axis.

From the results of the simulation, it can be understood that, in a case in which $N_{sub}$ is greater than or equal to 1.8, maximum heat generation temperature $T_{max}$ becomes less than 100° C. regardless of the value of $N_{kaku}$. Further, it can also be understood that, in a case in which $N_{sub}$ is greater than or equal to 0.56, the maximum heat generation temperature $T_{max}$ becomes less than 300° C. From the above, thermal design was carried out by computing the parameters of $N_{sub}$, $N_{kaku}$ and T that are such that the maximum heat generation temperature $T_{max}$ becomes less than 100° C. and less than 300° C. in the regions that do not correspond to these. The steps are as follows.

Figure 28:
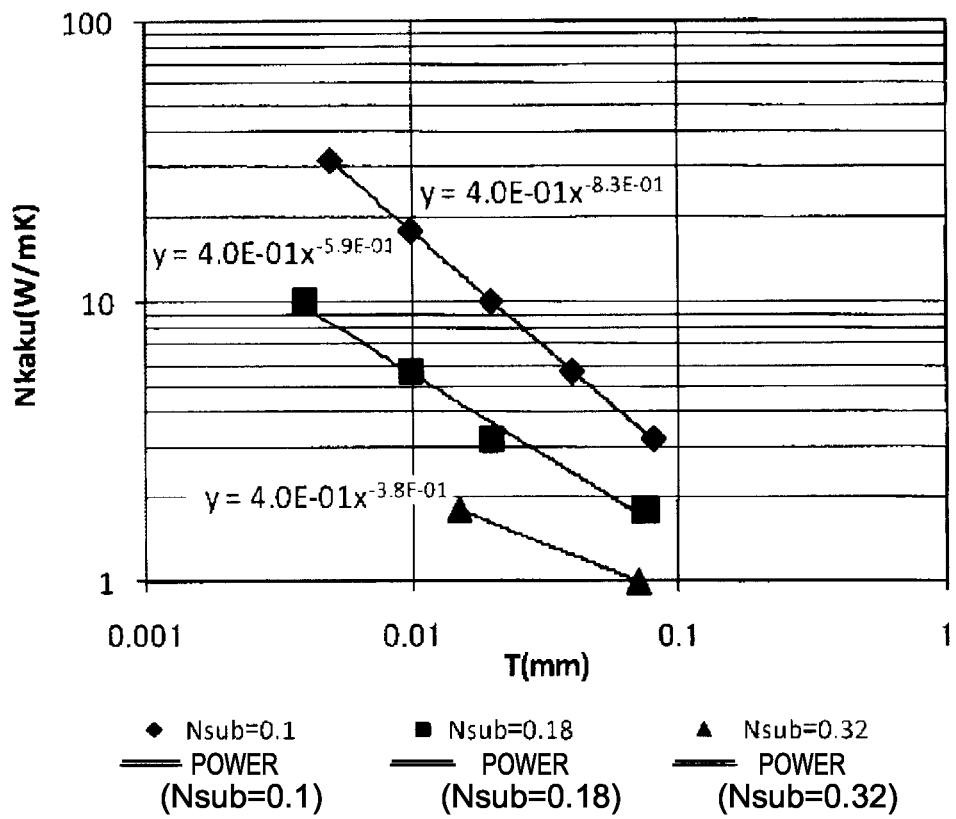
FIG. 28 is a drawing that plots the relationship between $N_{kaku}$ and T for each $N_{sub}$ at which $T_{max}$ becomes 300° C., that is based on the graphs of FIG. 16 through FIG. 27.

(1) On the basis of the graphs shown in FIG. 16 through FIG. 27, the relationship between $N_{kaku}$ and T for each $N_{sub}$ at which $T_{max}$ becomes 300° C. was plotted in FIG. 28. Further, on the basis of the graphs shown in FIG. 16 through FIG. 27, the relationship between $N_{kaku}$ and T for each $N_{sub}$ at which $T_{max}$ becomes 100° C. was plotted in FIG. 29.

(2) Power fitting was carried out, and $N_{kaku} \propto T^{-A}$ of each Nsub was determined (e.g., in FIG. 28, y=0.4×x$^{-0.83}$, and the like).

Figure 29:
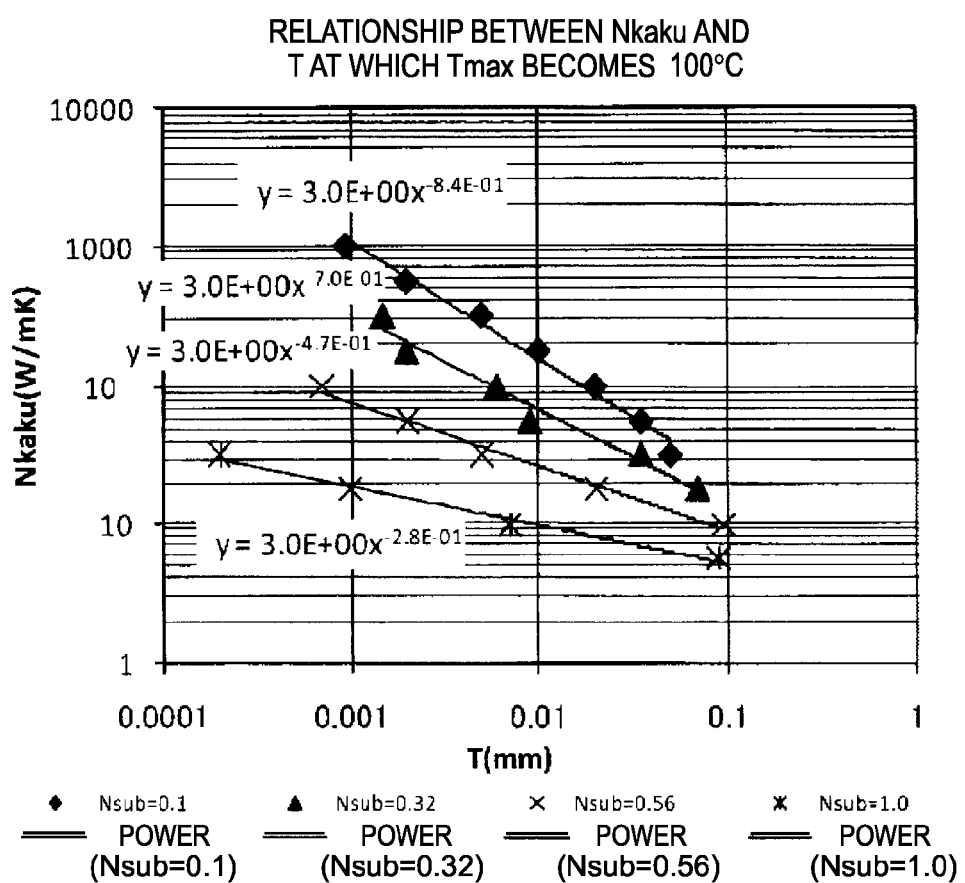
FIG. 29 is a drawing that plots the relationship between $N_{kaku}$ and T for each $N_{sub}$ at which $T_{max}$ becomes 100° C., that is based on the graphs of FIG. 16 through FIG. 27.
Figure 30:
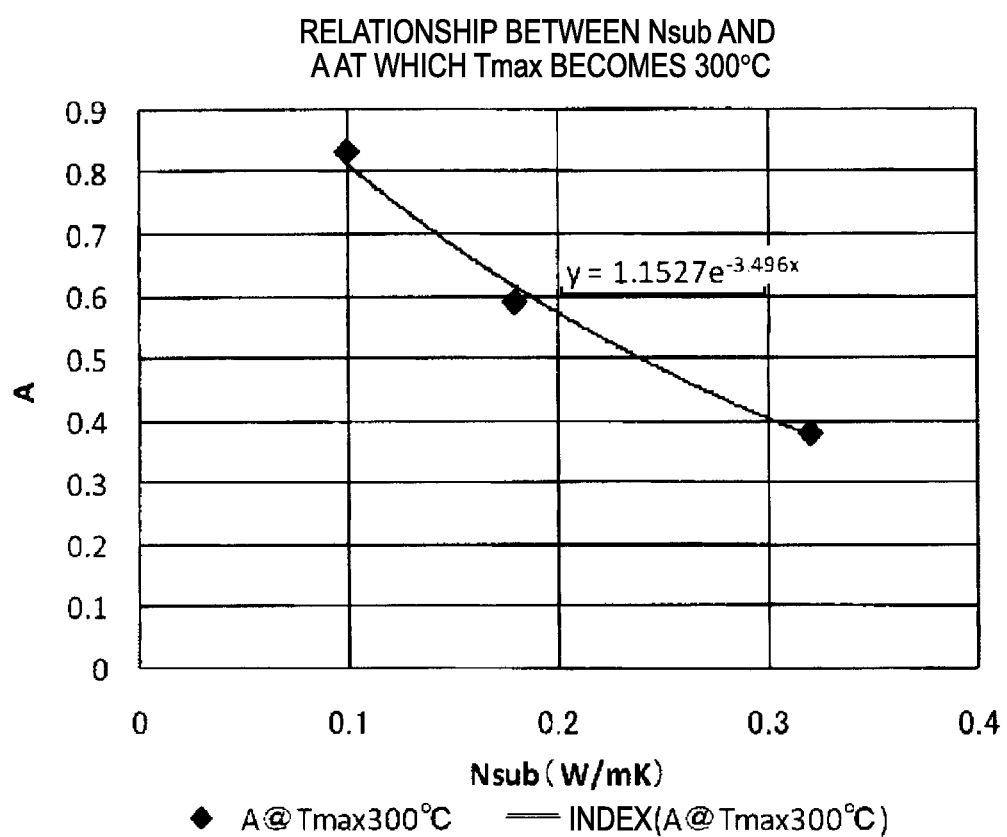
FIG. 30 is a drawing showing the relationship between $N_{sub}$ and parameter A, at which a maximum heat generation temperature $T_{max}$ becomes 300° C.
Figure 31:
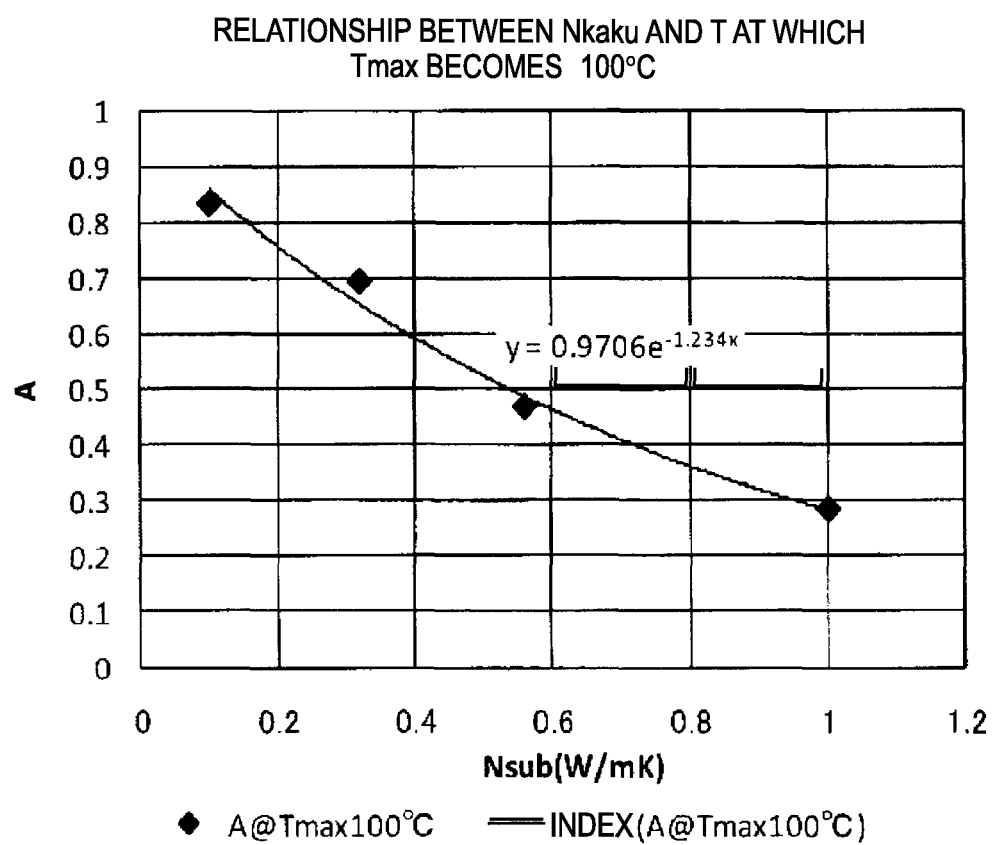
FIG. 31 is a drawing showing the relationship between $N_{sub}$ and parameter A, at which the maximum heat generation temperature $T_{max}$ becomes 100° C.

(3) Index fitting was carried out by $N_{sub}$ on parameter A of each $N_{sub}$. These results are shown in FIGS. 30, 29. FIG. 30 is a drawing showing the relationship between $N_{sub}$ and parameter A, at which the maximum heat generation temperature $T_{max}$ becomes 300° C. FIG. 31 is a drawing showing the relationship between $N_{sub}$ and parameter A, at which the maximum heat generation temperature $T_{max}$ becomes 100° C.

(4) The correlation parameters between $N_{kaku}$ and $N_{sub}$ and T are yielded from FIG. 30, FIG. 31. Here, parameter T of the film thickness is converted into S (=T×R) that includes the planar opening ratio R. Note that R assumes a value of 0≤R≤1.

From the above results, it was understood that, at the region in which the maximum heat generation temperature $T_{max}$ is less than 300° C., when the thermal conductivity $N_{sub}$ of the substrate 502 satisfies the condition $N_{sub}$<0.56 W/mK, the thermal conductivity $N_{kaku}$ of the heat diffusion layer 504 must satisfy the conditions $N_{kaku}$>0.4×S^(-1.2×e^(-3.5×$N_{sub}$)) and $N_{kaku} \geq N_{sub}$.

Further, it was understood that, at the region in which $T_{max}$ is less than 100° C., when the thermal conductivity $N_{sub}$ of the substrate 502 satisfies the condition $N_{sub}$<1.8 W/mK, the thermal conductivity $N_{kaku}$ of the heat diffusion layer 504 must satisfy the conditions $N_{kaku}$>3.0×S^(-0.97×e^(-1.2×$N_{sub}$)) and $N_{kaku} \geq N_{sub}$.

Note that "e" in the above formulas means the natural logarithm, and "^" means the power. Further, "E" in FIG. 28 for example means "10".

Further, the above formulas are designed such that the heat generation temperature, when the driving conditions of the element are Vg=20 V and Vds=50 V, becomes less than 100° C. or less than 300° C. However, these driving conditions are ultimately examples, and, even if the driving conditions of the element are other conditions, in the above formulas, the heat generation temperature can become less than 100° C. or less than 300° C.

What is claimed is:

1. A field effect transistor having, on a resin substrate, at least a gate electrode, a gate insulating film, an active layer mainly containing an oxide semiconductor that contains at least one of In, Ga or Zn, a source electrode, and a drain electrode, the field effect transistor comprising:
   a heat diffusion layer that is the same as or separate from the gate insulating film, and that is different than the gate electrode, the source electrode and the drain electrode,
   wherein, given that a thermal conductivity of the resin substrate is $N_{sub}$ (W/mK), a thermal conductivity of the heat diffusion layer is $N_{kaku}$ (W/mK), a film thickness of the heat diffusion layer is T (mm), an opening ratio of the heat diffusion layer is R (0≤R≤1), and S=T×R,
   the thermal conductivity $N_{sub}$ of the resin substrate satisfies the condition $N_{sub}$<1.8, and
   the thermal conductivity $N_{kaku}$ of the heat diffusion layer satisfies the conditions $N_{kaku}$>3.0×S^(-0.97×e^(-1.2×$N_{sub}$)) and $N_{kaku} \geq N_{sub}$.

2. The field effect transistor of claim 1, wherein at least one layer or more of a thin film of less than or equal to 1 μm exists between the active layer and the heat diffusion layer.

3. The field effect transistor of claim 2, wherein the heat diffusion layer is a nitride film containing at least one of Al or Ga.

4. The field effect transistor of claim 3, wherein the transmittivity of the heat diffusion layer is greater than or equal to 70% with respect to light of a wavelength range of greater than or equal to 400 nm and less than or equal to 700 nm.

5. A display device comprising the field effect transistor of claim 1.

6. A sensor comprising the field effect transistor of claim 1.

7. A field effect transistor having, on a resin substrate, at least a gate electrode, a gate insulating film, an active layer mainly containing an oxide semiconductor that contains at least one of In, Ga or Zn, a source electrode, and a drain electrode, the field effect transistor comprising:
a heat diffusion layer that is the same as or separate from the gate insulating film, and that is different than the gate electrode, the source electrode and the drain electrode,
wherein, given that a thermal conductivity of the resin substrate is $N_{sub}$ (W/mK), a thermal conductivity of the heat diffusion layer is $N_{kaku}$ (W/mK), a film thickness of the heat diffusion layer is T (mm), an opening ratio of the heat diffusion layer is R ($0 \leq R \leq 1$), and S=T×R, the thermal conductivity $N_{sub}$ of the resin substrate satisfies the condition $N_{sub} < 0.5$, and
the thermal conductivity $N_{kaku}$ of the heat diffusion layer satisfies the conditions $N_{kaku} > 0.4 \times S^{\wedge}(-1.2 \times e^{\wedge}(-3.5 \times N_{sub}))$ and $N_{kaku} \geq N_{sub}$.

8. The field effect transistor of claim 7, wherein at least one layer or more of a thin film of less than or equal to 1 μm exists between the active layer and the heat diffusion layer.

9. The field effect transistor of claim 8, wherein the heat diffusion layer is a nitride film containing at least one of Al or Ga.

10. The field effect transistor of claim 9, wherein the transmittivity of the heat diffusion layer is greater than or equal to 70% with respect to light of a wavelength range of greater than or equal to 400 nm and less than or equal to 700 nm.

11. A display device comprising the field effect transistor of claim 7.

12. A sensor comprising the field effect transistor of claim 7.

* * * * *